(12) United States Patent
Sato

(10) Patent No.: US 9,490,303 B2
(45) Date of Patent: Nov. 8, 2016

(54) LIGHT SOURCE AND DISPLAY DEVICE USING THE LIGHT SOURCE

(71) Applicant: Japan Display Inc., Tokyo (JP)

(72) Inventor: Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/574,811

(22) Filed: Dec. 18, 2014

(65) Prior Publication Data

US 2015/0187989 A1 Jul. 2, 2015

(30) Foreign Application Priority Data

Dec. 26, 2013 (JP) .................................. 2013-268754

(51) Int. Cl.
*H01L 29/22* (2006.01)
*H01L 27/32* (2006.01)
*H01L 51/52* (2006.01)

(52) U.S. Cl.
CPC ......... *H01L 27/322* (2013.01); *H01L 27/3244* (2013.01); *H01L 51/5271* (2013.01); *H01L 2227/323* (2013.01)

(58) Field of Classification Search
CPC ... H01L 51/56; H01L 33/62; H01L 51/0072; H01L 43/02; H01L 43/08
USPC .......................................................... 257/98
See application file for complete search history.

(56) References Cited

U.S. PATENT DOCUMENTS

| 2008/0185954 A1* | 8/2008 | Fukuda ............... H01L 27/3211 313/483 |
| 2009/0212696 A1* | 8/2009 | Terao .................. H01L 51/5265 313/506 |
| 2010/0230681 A1* | 9/2010 | Taneda ............... H01L 27/3211 257/59 |
| 2011/0074753 A1 | 3/2011 | Yamamoto et al. |
| 2012/0200555 A1 | 8/2012 | Omoto |

FOREIGN PATENT DOCUMENTS

| JP | 2000-268980 A | 9/2000 |
| JP | 2003-243182 A | 8/2003 |
| JP | 2009-043614 A | 2/2009 |
| JP | 2010-218805 A | 9/2010 |
| JP | 2011-071277 A | 4/2011 |
| JP | 2012-163651 A | 8/2012 |

OTHER PUBLICATIONS

Korean Offce Action mailed on May 18, 2016 for the coresponding Korean patent application No. 10-2014-0177222 , with Partial English Translation.

* cited by examiner

*Primary Examiner* — Andy Huynh
(74) *Attorney, Agent, or Firm* — Typha IP LLC

(57) ABSTRACT

The display device is arranged with a pair of reflection layers arranged facing each other and which function as an anode and cathode of a light emitting layer, a light emitting layer sandwiched between the pair of reflection layers and arranged in a pixel of a display region, a transparent conductive layer contacting the light emitting layer and arranged so as to overlap an aperture part seen from a planar view, wherein the aperture part is arranged in one of the pair of reflection layers and is arranged with a color filter including a pigment layer therein.

20 Claims, 36 Drawing Sheets

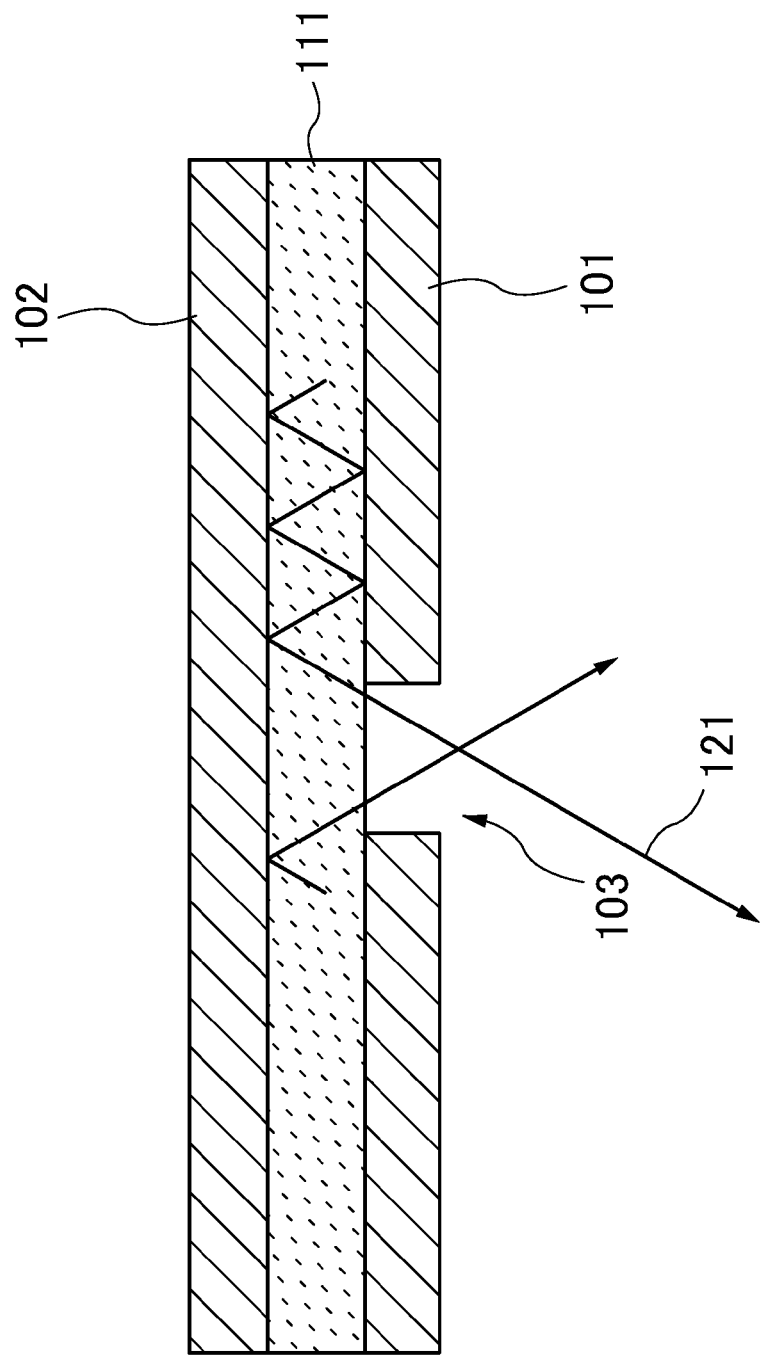

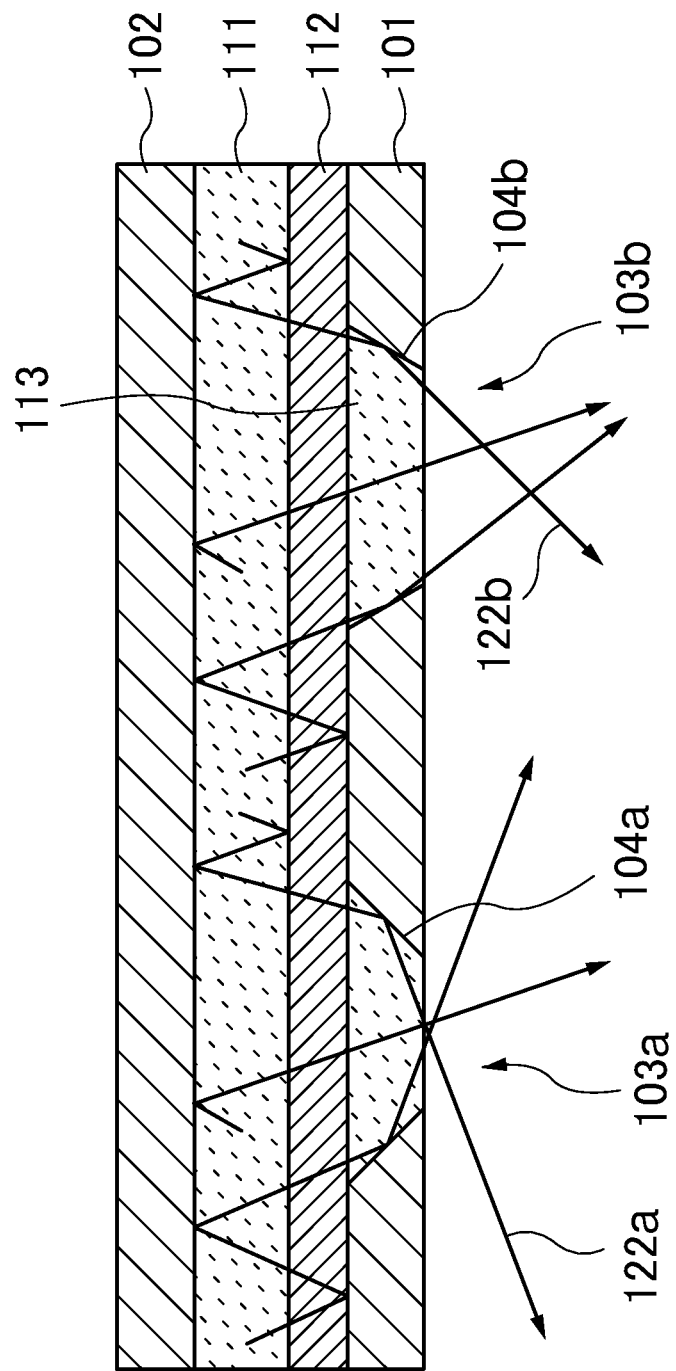

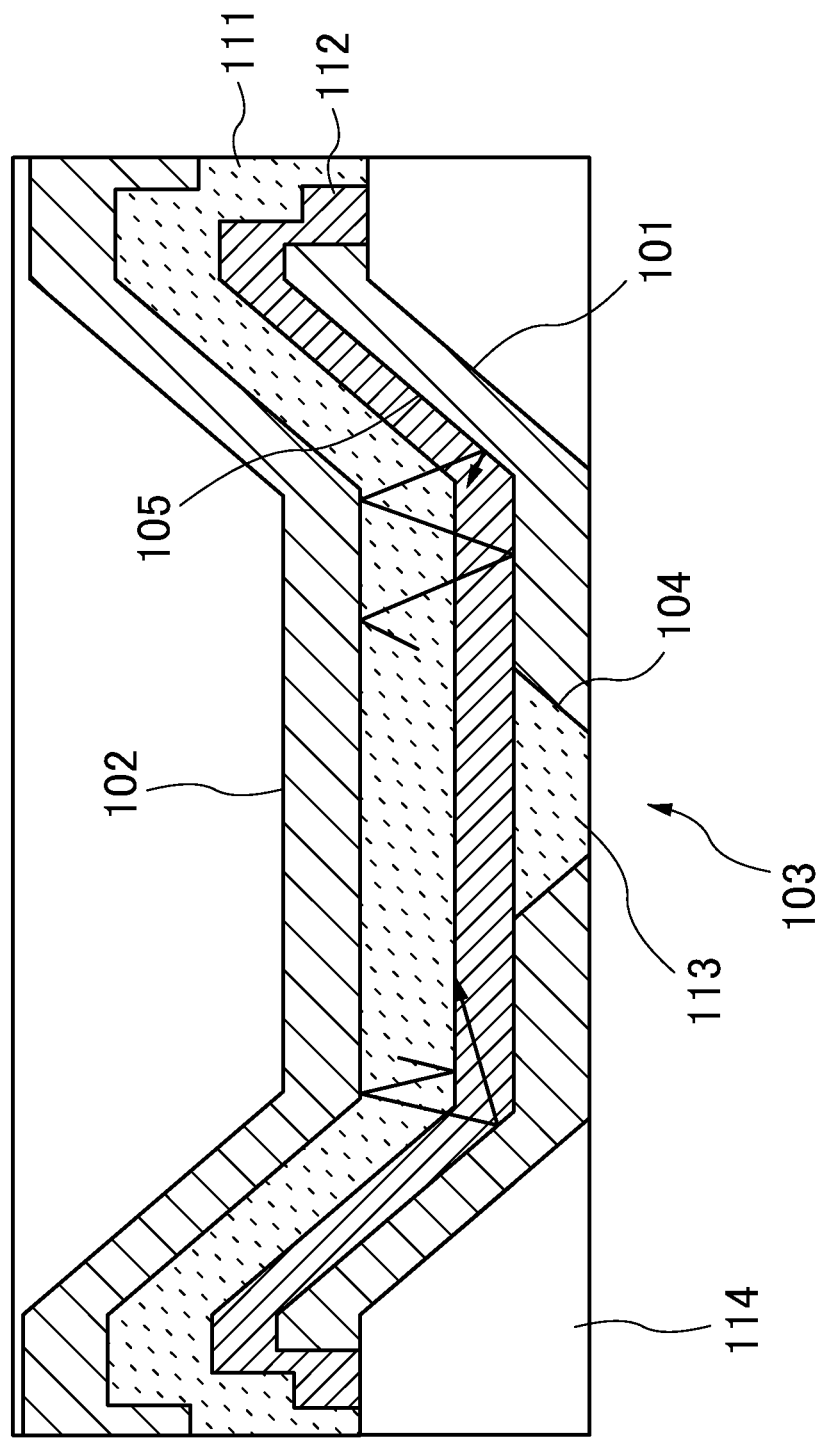

LIGHT SOURCE AND DISPLAY DEVICE USING THE LIGHT SOURCE

CROSS REFERENCE TO RELATED APPLICATIONS

This application is based upon and claims the benefit of priority from the prior Japanese Patent Application No. 2013-268754, filed on Dec. 26, 2013, the entire contents of which are incorporated herein by reference.

FIELD

The present invention is related to a light source and a display device which uses the light source as a light emitting element arranged in a pixel, in particular, and the disclosed embodiment are related to a light source and a structure of a display device which uses the light source.

BACKGROUND

In recent years, in a light emitting display device for mobile purposes, there is a strong demand for high resolution and low power consumption. Display devices which use a liquid crystal display device (LCD) or organic light-emitting diode (OLED) such an organic EL display device or electronic paper etc are being adopted as display devices for mobile purposes.

Among these, an organic EL display device does not require a back light or polarizing plate which were necessary in liquid crystal devices. Furthermore, since the drive voltage of a light emitting element which is a light source is low, these devices are attracting a great deal of attention as low power consumption and thin light emitting display devices. In addition, since it is possible to form a display device just with a thin film, it is possible to realize a display device capable of bending (flexible). Furthermore, since these display devices do not use a glass substrate, they are attracting a great deal of attention as display devices which are light and difficult to break. In particular, in a organic EL display device of a medium/small size, high definition of a display part is required. For example, with the progress in high definition display devices, because the space between adjacent pixels becomes narrow, the amount of light leaking from an end part of a pixel which reaches an adjacent pixel increases. When light generated in a pixel is emitted to the exterior from an adjacent pixel, problems such as a drop in definition or bad color reproduction occur.

In an organic EL display device, light is emitted by flowing a current to a light emitting element of a light source. The light which is emitted from a light emitting element proceeds to the side of a viewer via a different layer. However, a part of the light is reflect at the interface where different layers contact, is wave guided through a layer, is transmitted to a pixel adjacent to a pixel which is to supposed to emit light and is emitted to the exterior from the adjacent pixel, which leads to what is called leaked light. In particular, in high definition display devices which exceed 300 ppi, among the light generated in a light emitting element about 80% is lost due to wave guiding through each layer as described above.

Therefore, in patent document 1 for example, in the case where a white light organic EL element and color filter type are used, a technology is disclosed in which leaked light is controlled between each pixel by arranged a light shielding layer between each color filter which controls a reduction in color reproduction. However, in the structure disclosed in Japanese Laid Open Patent 2012-163651, a part of the light emitted in the direction of a viewer from a light emitting element is absorbed in the light shielding layer which leads to a drop in light emitting efficiency.

SUMMARY

A display device according to one embodiment of the present invention includes a pair of reflection layers arranged facing each other, a light emitting layer held by the pair of reflection layers, and an aperture part arranged in one of the reflection layers of the pair of reflection layers.

In addition, in another aspect, the light emitting layer may be arranged in a pixel of a display region and light generated in the light emitting layer is emitted via the aperture part.

In addition, in another aspect, the pair of reflection layers may be an anode and a cathode of the light emitting layer.

In addition, in another aspect, a transparent electrode layer may be further arranged between the pair of reflection layers.

In addition, in another aspect, the transparent electrode layer may be in contact with the light emitting layer.

In addition, in another aspect, the transparent electrode layer may be formed to overlap the aperture part as seen from a planar view.

In addition, in another aspect, a resin layer may be arranged on the aperture part side of the transparent electrode layer.

In addition, in another aspect, the resin layer may include a color filter having a pigmented layer.

In addition, in another aspect, the resin layer may planarize a step formed by the aperture part.

In addition, in another aspect, an inorganic insulation layer may be arranged between the substrate of the display device and the aperture part.

In addition, in another aspect, one of the reflection layers may include a first slanted surface between the aperture part and an outer periphery end part of the reflection layer.

In addition, in another aspect, one of the reflection layers may include a first slanted surface between the aperture part and an outer periphery end part of the reflection layer, and one part of the light emitting layer is arranged above the first slanted surface.

In addition, in another aspect, a color filter may further include a pigmented layer and be arranged between the aperture part and the substrate of the display device.

In addition, in another aspect, the first slanted surface may extend connected from the aperture part.

In addition, in another aspect, a plurality of the aperture parts may be arranged in one pixel, and the first slanted surface of each aperture part has a mutually different slanted angle.

In addition, in another aspect, one of the reflection layers may include a second slanted surface further to the exterior than the first slanted surface.

A light source according to one embodiment of the present invention includes a pair of reflection layers arranged facing each other; a light emitting layer held by the pair of reflection layers, and an aperture part arranged in one reflection layer of the pair of reflection layers.

In addition, in another aspect, light generated by the light emitting layer may be emitted via the aperture part.

In addition, in another aspect, the pair of reflection layers may be an anode and a cathode of the light emitting layer.

In addition, in another aspect, a transparent electrode layer may be arranged between the pair of reflection layers.

In addition, in another aspect, the transparent electrode layer may be in contact with the light emitting layer.

In addition, in another aspect, the transparent electrode layer may be formed to overlap the aperture part as seen from a planar view.

In addition, in another aspect, a resin layer may be arranged on the aperture part side of the transparent electrode layer.

In addition, in another aspect, the resin layer may include a color filter having a pigmented layer.

In addition, in another aspect, the resin layer may planarize a step formed by the aperture part.

In addition, in another aspect, one of the reflection layers may include a first slanted surface between the aperture part and an exterior periphery end part of the reflection layer.

In addition, in another aspect, one of the reflection layers may include a first slanted surface between the aperture part and an exterior periphery end part of the reflection layer, and one part of the light emitting layer is arranged above the first slanted surface.

In addition, in another aspect, a color filter may include a pigmented layer and arranged between the aperture part and a substrate of the display device.

In addition, in another aspect, the first slanted surface may extend connected from the aperture part.

In addition, in another aspect, a reflection body may be arranged between the pair of reflection layers, and reflecting light progressing in a direction of the exterior periphery end part of the pair of reflection layers to at least the direction of the aperture part.

BRIEF DESCRIPTION OF DRAWINGS

FIG. 1 is a diagram showing a cross-sectional structure of a light source in embodiment one of the present invention;

FIG. 6 is a diagram showing a cross-sectional structure of a light source in embodiment five of the present invention;

FIG. 7A is a diagram showing a cross-sectional structure of a light source in embodiment six of the present invention;

DESCRIPTION OF EMBODIMENTS

Figure 2A:
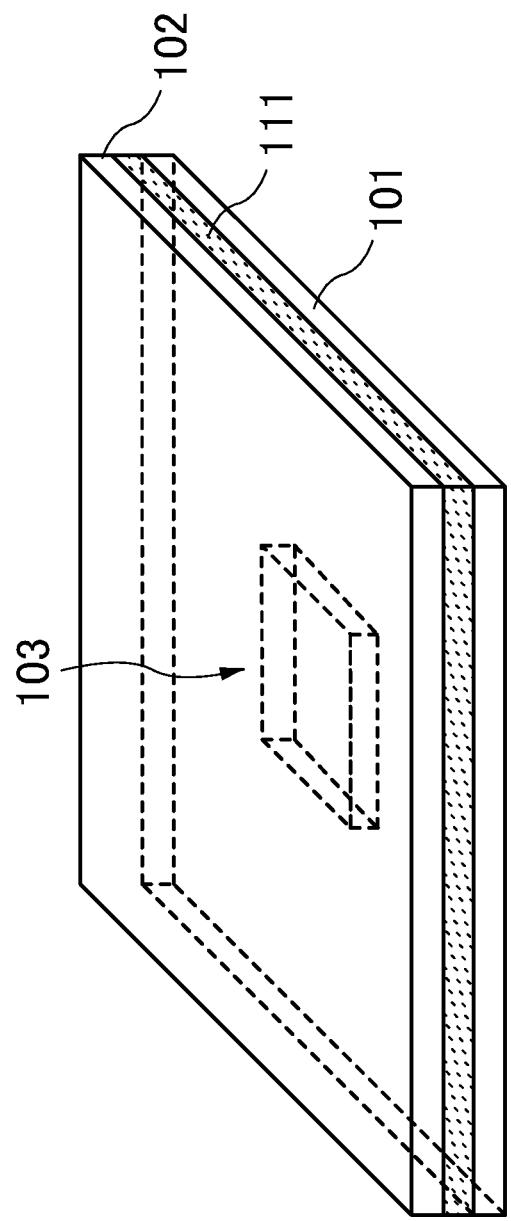
FIG. 2A is a diagram showing a perspective view of a light source in embodiment one of the present invention.

Each embodiment of the present invention is explained below while referring to the drawings. Furthermore, the disclosure is merely one example and various modifications which conform with the premise of the invention and which could be easily conceived of by person ordinarily skilled in the art are included within the scope of the present invention. In addition, in order to further clarify explanation, the drawings may be expressed schematically with respect to the width, thickness and shape of each part compared to actual appearance and are only examples and do not limit the interpretation of the present invention. In addition, in the specification and each drawing the same reference symbols are attached to the same elements that have previously been described or already exist in previous drawings and therefore a detailed explanation is sometimes omitted where appropriate.

(Embodiment One)

Figure 2B:
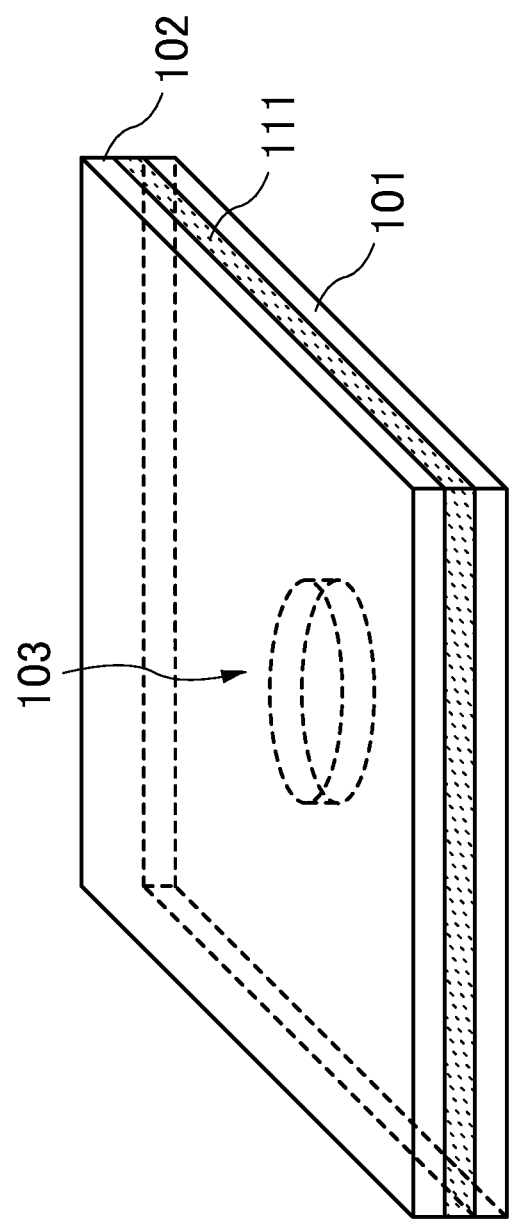
FIG. 2B is a diagram showing a perspective view of a light source in embodiment one of the present invention.

A structure of a light source related to embodiment one of the present invention is explained using FIG. 1, FIG. 2A and FIG. 2B. FIG. 1 is a diagram showing a cross-sectional structure of a light source in embodiment one of the present invention. In addition, FIG. 2A and FIG. 2B are diagrams showing a perspective view of a light source in embodiment one of the present invention. The light source explained in embodiment one can be applied to various purposes such as a light emitting element arranged in a pixel of a display device, a backlight of a liquid crystal display device, lighting or a laser light source and the like.

The light source in embodiment one includes a pair of reflection layers 101, 102 arranged facing each other and a light emitting element 111 sandwiched between the pair of reflection layers 101, 102 as shown in FIG. 1. In addition, an aperture part 103 is arranged in one of the reflection layers 101. In FIG. 2A, a square shaped aperture part 103 is arranged near the center part of the reflection layer 101. In FIG. 1, although an example of a structure in which the reflection layers 101, 102 and light emitting layer 111 are in contact is shown, the invention is not limited to this structure. Another layer may be inserted between the reflection layer 101 and light emitting layer 111 or between the reflection layer 102 and light emitting layer 111. In addition, although an example of a structure in which the aperture part 103 is arranged near the center part of the reflection layer 101 is shown in FIG. 2A, the present invention is not limited to this structure. The aperture part 103 may also be arranged at a position near the exterior periphery end part of the pattern of the reflection layer 101. In addition, although the aperture part 103 has a square shape in FIG. 2A, the aperture part 103 may also have a round shape as in FIG. 2B.

Light 121 generated in the light emitting layer 111 is emitted isotropically from a light emitting point and proceeds through the light emitting layer 111 while being reflected by the pair of the reflection layers 101, 102. In addition, light 121 which reaches the aperture part 103 is emitted to the exterior via the aperture part 103.

Here, the reflection layers 101, 102 may be both formed by a metal having reflection properties. For example, the reflection layer 101 may be an anode which supplies holes to the light emitting layer 111 and the reflection layer 102 may be a cathode which supplies electrons to the light emitting layer 111. In addition, a hole injection layer and hold transport layer may be arranged between the anode and light emitting layer and an electron injection layer and electron transport layer may be arranged between the cathode and light emitting layer. In addition, light emitted in the light emitting layer may be a single color emitted at a R (red), G (green) or B (blue) wavelength or white light obtained by stacking a plurality of light emitting layers.

As described above, according to the light source in embodiment one, light generated in the light emitting layer 111 is repeatedly reflected by the pair of reflection layers 101, 102. In addition, light which reaches the aperture part 103 is emitted to the exterior. Therefore, most of the light other than the light emitted to the exterior from the periphery of the pair of reflection layers 101, 102 can be emitted from the aperture part 103. That is, it is possible to focus a part of the emitted light on a desired location by controlling the position of the aperture where the light is emitted. Therefore, it is possible to remove loss due to absorption by an obstacle and improve light emitting efficiency by avoiding an obstacle such as a light shielding layer and arranging the aperture part 103.

(Embodiment Two)

Figure 3:
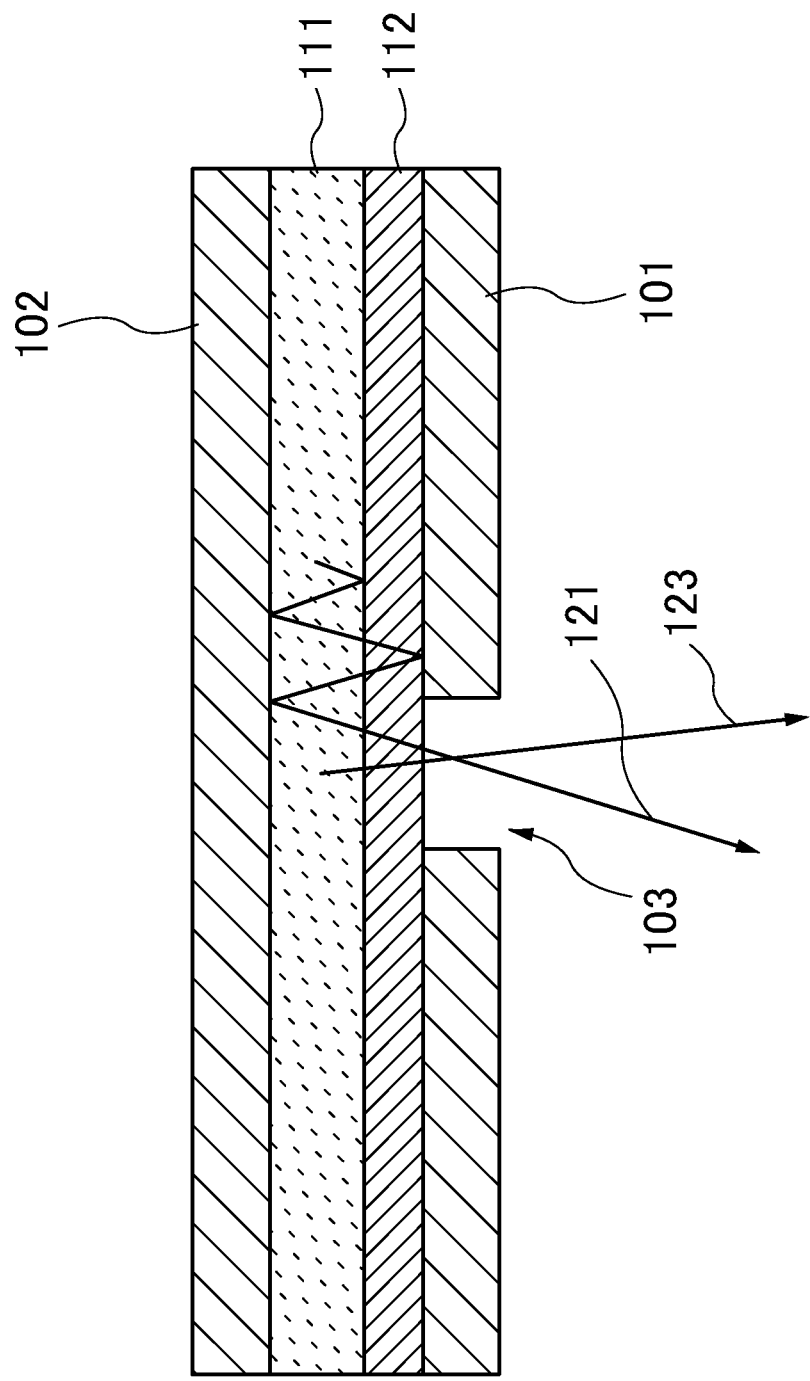
FIG. 3 is a diagram showing a cross-sectional structure of a light source in embodiment two of the present invention.

The structure of a light source in embodiment two of the present invention is explained using FIG. 3. FIG. 3 is a diagram showing a cross-sectional structure of a light source in embodiment two of the present invention. The light source explained in embodiment two can be applied to various purposes such as a light emitting element arranged in a pixel of a display device, a backlight of a liquid crystal display device, lighting or a laser light source and the like.

In FIG. 3, a transparent conductive layer 112 is arranged between the reflection layer 101 used as an anode of the light emitting layer and the light emitting layer 111. In addition, in FIG. 3, the aperture part 103 is arranged only in the reflection layer 101 and the transparent conductive layer 112 is arranged in a region corresponding to the aperture part 103. In other words, the transparent conductive layer 112 is arranged to overlap the aperture part 103 when seen from a planar view. Here, the transparent conductive layer 112 is preferred to contact the light emitting layer 111. In addition, a material with a high work function such as ITO (Indium Tin Oxide) is preferred to be used as the transparent conductive layer.

In FIG. 3, light generated in the light emitting layer 111 is emitted isotropically from a light emitting point and proceeds through the light emitting layer 111 and transparent conductive layer 112 while being reflected at the pair of reflection layers 101, 102 and the interface of light emitting layer 111 and the transparent conductive layer 112. In addition, light 121 which reaches the aperture part 103 is emitted to the exterior via the aperture part 103. In addition, because the transparent conductive layer 112 is arranged in a region corresponding to the aperture part 103, a current is also supplied to the light emitting layer 111 arranged in a region corresponding to the aperture part 103 and the light emitting layer 111 in this region emits light 123.

In addition, by arranging a material with a high work function such as ITO between the light emitting layer 111 and reflection layer 101 uses as the anode, it is possible to improve the injection characteristics of holes to the light emitting layer 111.

As described above, according to the light source related to embodiment two, light 121 generated in the light emitting layer 111 is repeatedly reflected and emitted to the exterior when it reaches the aperture part 103. Furthermore, because light is also generated in the light emitting layer 111 in the region corresponding to the aperture part 103, the area which generates light among the light emitting layer can be increased and light emitting efficiency can be further improved. Therefore, it is possible to emit most of the light from the aperture part 103 apart from the light that is emitted to the exterior from the periphery of the pair of reflection layers 101, 102. That is, it is possible to focus a part of the emitted light on a desired location by controlling the position of the aperture where the light is emitted. Therefore, it is possible to remove loss due to absorption by an obstacle and improve light emitting efficiency by avoiding an obstacle such as a light shielding layer and arranging the aperture part 103.

(Embodiment Three)

Figure 4:
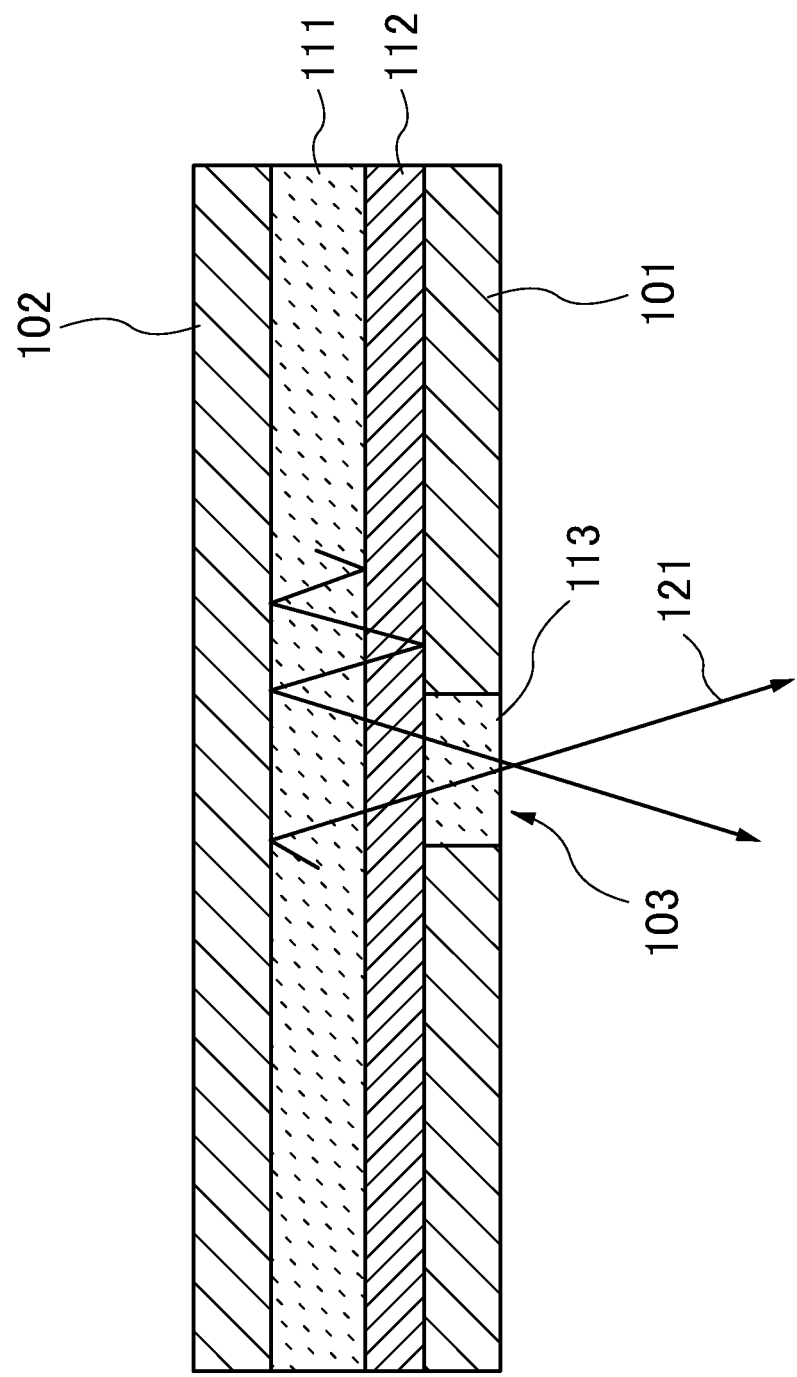
FIG. 4 is a diagram showing a cross-sectional structure of a light source in embodiment three of the present invention.

The structure of a light source in embodiment three of the present invention is explained using FIG. 4. FIG. 4 is a diagram showing a cross-sectional structure of a light source in embodiment three of the present invention. The light source explained in embodiment three can be applied to various purposes such as a light emitting element arranged in a pixel of a display device, a backlight of a liquid crystal display device, lighting or a laser light source and the like.

In FIG. 4, a resin layer 113 may be arranged in a region corresponding to the aperture part 103 in FIG. 3. The resin layer 113 may be arranged so as to fill the aperture part 103 or may be arranged just in one part of the aperture part 103. In addition, a color filter including a pigment layer may be used as the resin layer 113.

In the case where the light source shown in FIG. 4 is manufactured by forming the reflection layer 101, forming the resin layer 113 in the aperture part 103 of the reflection layer 101, and forming the transparent conductive layer 112, light emitting layer 111 and reflection layer 102 in this order above the reflection layer 101 and resin layer 113, it is possible to relieve the step of the transparent conductive layer 112 formed by the aperture part 103 by arranging the resin layer 113 in the aperture part 103. In particular, by forming the resin layer 113 so as to fill the aperture part 103, it is possible to effectively ignore the effects of the step of the transparent conductive layer 112 formed by the aperture part 103. That is, in the light emitting region of the light emitting layer 111, it is possible to roughly uniform the thickness of the light emitting layer 111 between the anode and cathode. That is, it is possible to flatten the step formed by the aperture part 103.

When there is a section which is thinner compared to other sections in the light emitting layer between the anode and cathode, an electric field becomes locally stronger because the distance between the anode and cathode becomes shorter and an excessive current flow to the light emitting layer in this region. The light emitting layer in which an excessive current flow degrades significantly compared to other sections which leads to a decrease in light emitting intensity. However, as described above, according to embodiment three, it is possible to roughly uniform the thickness of the light emitting layer by flattening the step formed by the aperture part 103 and control any deviations in an electrical field. As a result, it is possible to obtain a highly reliable light source and make it difficult for local degradation in a light emitting layer.

In addition, it is possible to adjust the wavelength of light emitted to the exterior via the aperture part 103 by using a color filter as the resin layer 113. In this case, it is preferred that the light emitting layer 111 emits white light. For example, in a device in which a plurality of emitted light colors is arranged above the same substrate such as a display, a white light emitting element is arranged as the light emitting layer 111 and a color filter is arranged according to a pixel. Therefore, it is possible to form the light emitting layer 111 on the entire surface without painting it in different colors. As a result, it is possible to realize a high definition display device without the level of definition of the display being controlled by painting of the light emitting layer in different colors.

In addition, because the aperture part 103 which is an aperture for the light 121 generated in the light emitting layer 111 to be emitted is covered by a color filter, it is possible to control the problem of mixed colors due to leaked light from an adjacent light source even in a device including a plurality of light sources above the same substrate. In addition, because it is sufficient to arrange a color filter just in the region of the aperture part 103, it is possible to control the amount of material used for the color filter and reduce costs.

(Embodiment Four)

Figure 5:
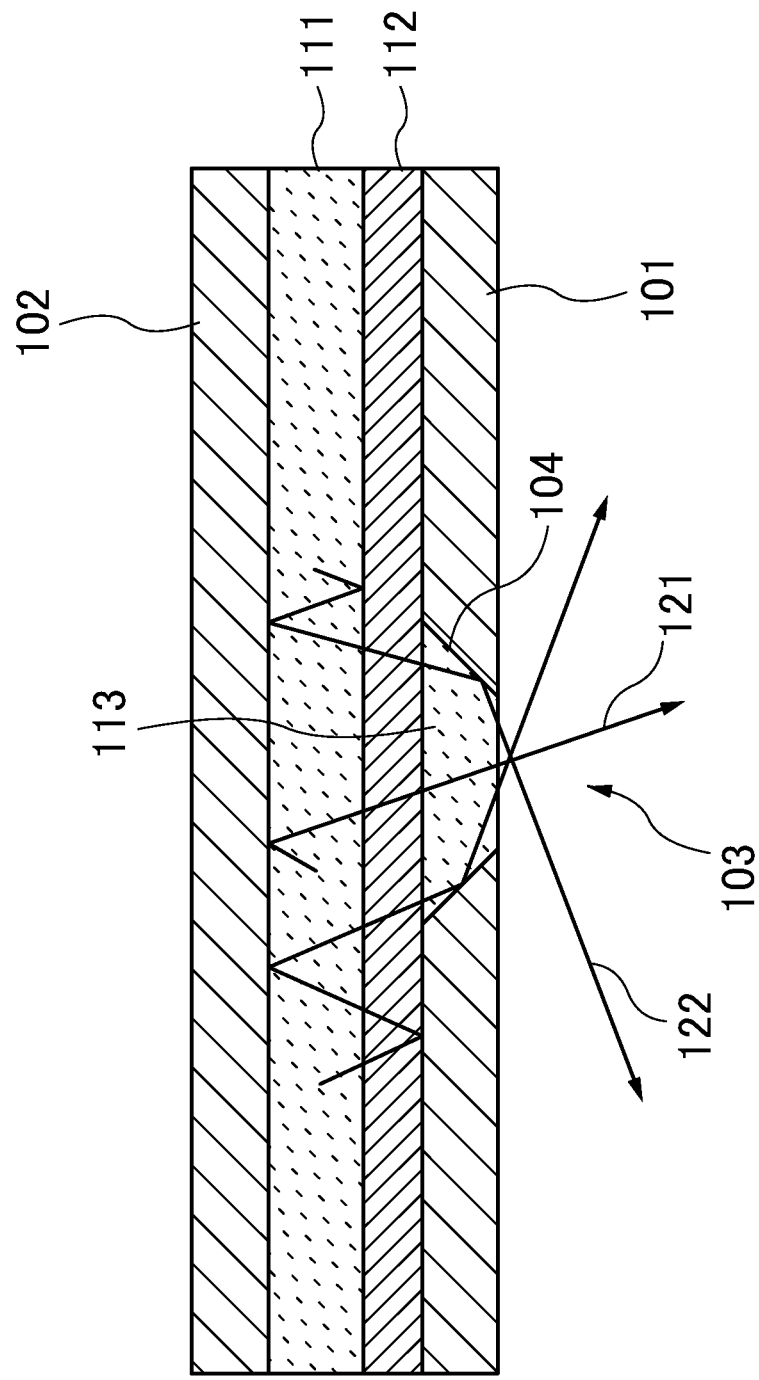
FIG. 5 is a diagram showing a cross-sectional structure of a light source in embodiment four of the present invention.

The structure of a light source in embodiment four of the present invention is explained using FIG. 5. FIG. 5 is a diagram showing a cross-sectional structure of a light source in embodiment four of the present invention. The light source explained in embodiment four can be applied to various purposes such as a light emitting element arranged in a pixel of a display device, a backlight of a liquid crystal display device, lighting or a laser light source and the like.

In FIG. 5, the side wall of the aperture part 103 in FIG. 4 includes a slanted surface 104. In other words, the reflection layer 101 includes a slanted surface 104 in the aperture part 103 and the slanted surface 104 extends connected from the end part of the aperture part 103. In addition, the same as FIG. 4, the resin layer 113 is arranged in the aperture part 103. Here, in FIG. 5, although a structure is shown in which the slanted surface 104 is arranged so as to correspond to the region of the aperture part 103, the present invention is not limited to this structure. The slanted surface 104 may be arranged at least in the vicinity of the end part of the aperture part 103 of the reflection layer 101.

In FIG. 5, when light generated in the light emitting layer 111 is reflected by the slanted surface 104, light such as light 122 is emitted in wide angle. Therefore, the viewing angle of the light source in the present invention becomes wider. In other words, side surface visibility of the light source in the present invention is improved. It is possible to adjust the viewing angle using the angle of the slanted surface 104. The preferred angle of the slanted surface 104 is 15 degrees or more and 75 degrees of less. In addition, a more preferable angle of the slanted surface 104 is 20 degrees or more and 60 degrees or less and an even more desirable angle of the slanted surface 104 is 30 degrees or more and 45 degrees or less.

As described above, according to embodiment four, it is possible to adjust the wavelength of the light emitted to the exterior via the aperture 103 and obtain a more desirable viewing angle.

(Embodiment Five)

The structure of a light source related to embodiment five of the present invention is explained using FIG. 6. FIG. 6 is a diagram showing a cross-sectional structure of a light source in embodiment five of the present invention. The light source explained in embodiment five can be applied to various purposes such as a light emitting element arranged in a pixel of a display device, a backlight of a liquid crystal display device, lighting or a laser light source and the like.

In FIG. 6, a plurality of aperture parts 103a, 103b are arranged in the reflection layer 101. Slanted surfaces 104a, 104b of each aperture part have mutually different slanted angles. In addition, similar to FIG. 4 and FIG. 5, the resin layer 113 is arranged in the aperture part 103a and 103b.

In FIG. 6, light 122a which is light generated in the light emitting layer 111 and reflected by the slanted surface 104a and light 122b which is light generated in the light emitting layer 111 and reflected by the slated surface 104b are omitted at different angles. That is, the light 122a emitted from the aperture part 103a and light 122b emitted from the aperture part 103b have different viewing angles.

As described above, according to embodiment five, by arranged a plurality of slanted surfaces with mutually different viewing angles it is possible to individually adjust the viewing angle in each aperture part and adjust the viewing angle with higher level of freedom.

(Embodiment Six)

The structure of a light source related to embodiment six of the present invention is explained using FIG. 7A. FIG. 7A is a diagram showing a cross-sectional structure of a light source in embodiment six of the present invention. The light source explained in embodiment six can be applied to various purposes such as a light emitting element arranged in a pixel of a display device, a backlight of a liquid crystal display device, lighting or a laser light source and the like.

In FIG. 7A, an interval wall 114 is arranged in a region further to the periphery than the aperture part 103. In this way, the reflection layer 101 includes a slanted surface 104 facing the aperture part 103 and a slanted surface 105 facing the reflection layer 101 arranged above the interval wall 114. Here, it is preferred that the slanting angle of the slanted surface 105 is large. In addition, the slanted surface 104 and slanted surface 105 are not limited to the straight line planar shape shown in FIG. 7A but may also be a curved surface shape.

In FIG. 7A, among the light generated in the light emitting layer 111, a part of the light which proceeds in the exterior side direction different to the aperture part 103 is reflected by the slanted surface 105. By this reflection, because the procession direction of the light proceeding towards to the exterior direction changes to the direction of the aperture part 103, it is possible to reduce the light emitted to the exterior from the exterior periphery. In other words, by providing the reflection layer 101 with the slanted surface 105 further to the exterior than the slanted surface 104, it is possible to reduce the light emitted to the exterior from the periphery of the pair of reflection layers 101, 102.

It is preferred that the slanted angle of the slanted surface 105 be large in order to reflect as much as light as possible in the direction of the aperture part 103. The slanted angle of the slanted surface 105 is preferred to be 45 degrees or more and 90 degrees or less. More preferably the slanted angle of the slanted surface if preferred to be 60 degrees or ore and 90 degrees or less. Here, it is sufficient that the above described slanted angle be provided in at least a region of one part of the slanted surface 105. For example, in the case where the slanted surface 105 is a curved surface, it is sufficient that at least one part of the curved surface of the slanted surface 105 is provided with the angle described above.

As described above, according to embodiment six, by arranging a slated surface which reflects light proceeding in the direction of the exterior side of the pair of reflection layers in the direction of the aperture part, it is possible to reduce the light which is emitted to the exterior from the exterior periphery of the pair of reflection layers and further improve light emitting efficiency.

Figure 7B:
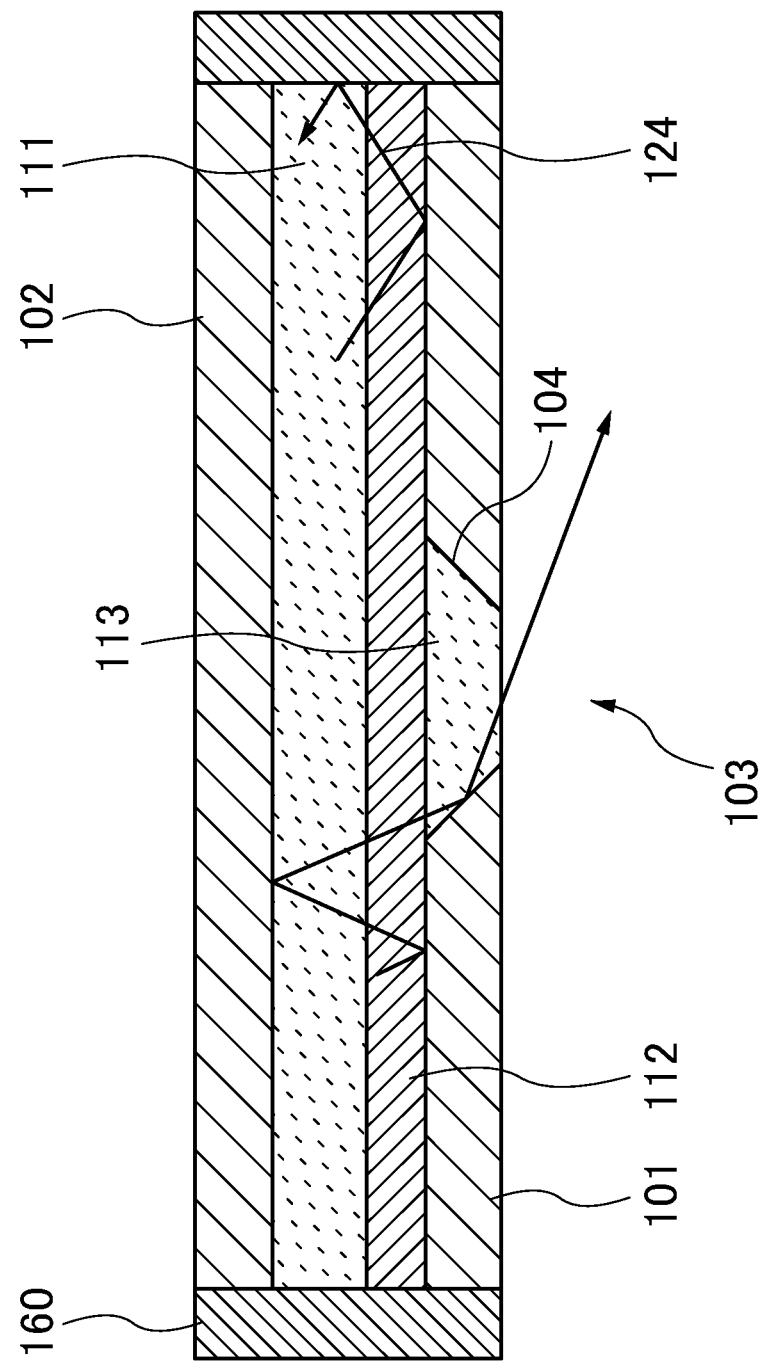
FIG. 7B is a diagram showing a cross-sectional structure of a light source in a modified example one in embodiment six of the present invention.
Figure 7C:
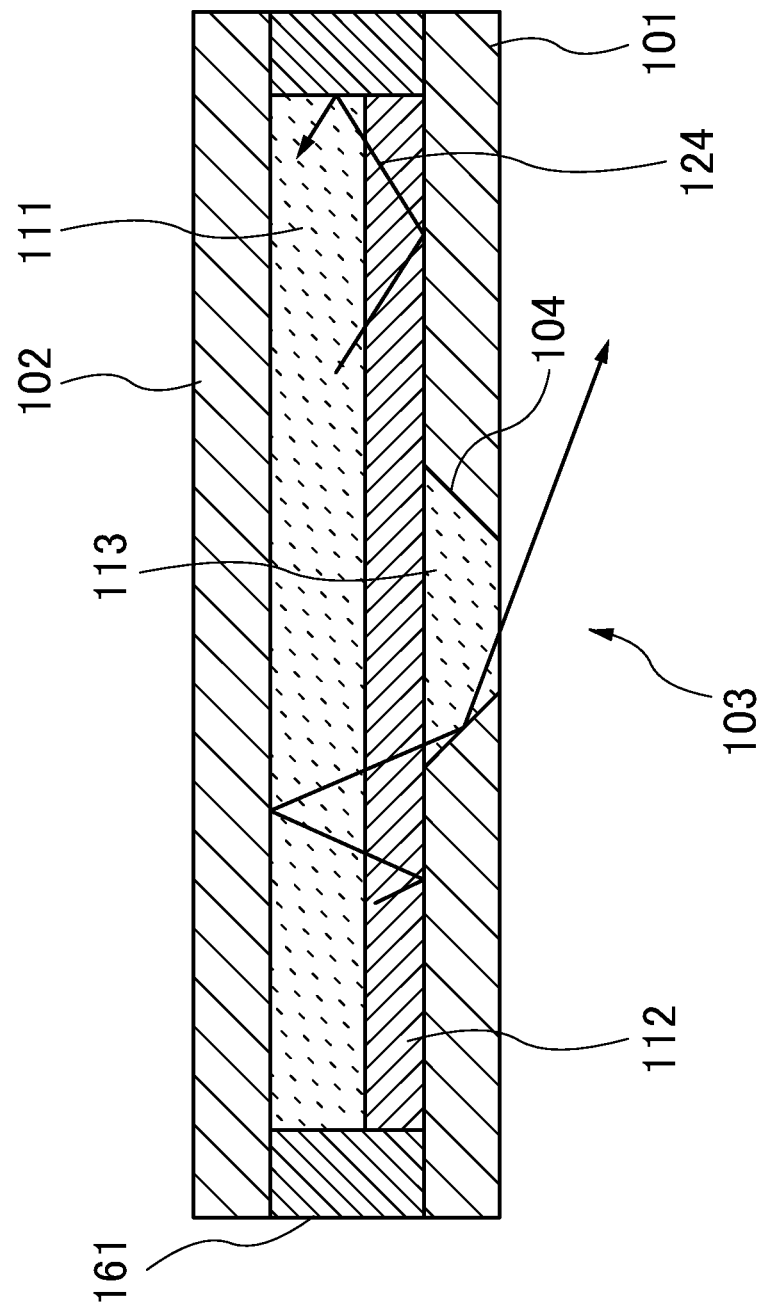
FIG. 7C is a diagram showing a cross-sectional structure of a light source in a modified example two in embodiment six of the present invention.

Next, a modified example of embodiment six is explained using FIG. 7B and FIG. 7C. FIG. 7B shows a cross-sectional structure of a light source in modified example one in embodiment six of the present invention. FIG. 7B includes a reflection body 160 on the exterior periphery end part of the pair of reflection layers 101, 102. It is sufficient that the reflection body 160 be arranged on at least one part of the exterior periphery end part of the light emitting layer 111 or transparent conductive layer 112. Preferably, the reflection body 160 may be arranged so as to completely cover the exterior periphery end part of the light emitting layer 111 and transparent conductive layer 112

Although, a structure is shown in FIG. 7B in which the reflection body 160 is in contact with exterior periphery end part of the light emitting layer 111 or the transparent conductive layer 112, the present invention is not limited to this structure. For example, an offset (gap) may be arranged between the exterior periphery end part of the light emitting layer 111 or transparent conductive layer 112 and the reflection body 160.

In FIG. 7B, one part of the light which processes in the direction of the exterior periphery end part of the pair of reflection layers 101, 102 among the light generated in the light emitting layer 111, is reflected in the direction of the aperture part 103 by the reflection body 160. That is, by arranging the reflection body 160 on the exterior periphery end part of the pair of the reflection layers 101, 102, it is possible to reduce light emitted to the exterior from the exterior periphery of the reflection layers 101, 102.

FIG. 7C shows a cross-sectional structure of a light source in a modified example two of embodiment six in the present invention. In FIG. 7C, a reflection body 161 is arranged between the pair of reflection layers 101, 102. The reflection body 161 may also be arranged at least on one part of the exterior periphery end part of the light emitting layer 111 or transparent conductive layer 112 in a region further on the exterior periphery than the slanted surface 104. Preferably, the reflection body 161 is arranged so as to completely cover the exterior periphery end part of the light emitting layer 111 and transparent conductive layer 112 in a region further to the exterior periphery than the slanted surface 104.

In FIG. 7C, a part of the light which proceeds in the direction of the exterior periphery end part of the pair of reflection layers 101, 102 among the light generated in the light emitting layer 111 is reflected in the direction of the aperture part 103 by the reflection body 161. That is, by arranging the reflection body 161 between the pair of reflection layers 101, 102 it is possible to reduce the light being emitted to the exterior from the exterior periphery of the reflection layers 101, 102.

(Embodiment Seven)

The structure of a display device related to embodiment seven of the present invention is explained using FIG. 8 to FIG. 19. Here, a display device displaying a two dimensional image arranged with pixels in a matrix shape as a light emitting element using the light source explained in any one of embodiments one to six is explained.

(Summary of a Display Device)

Figure 8:
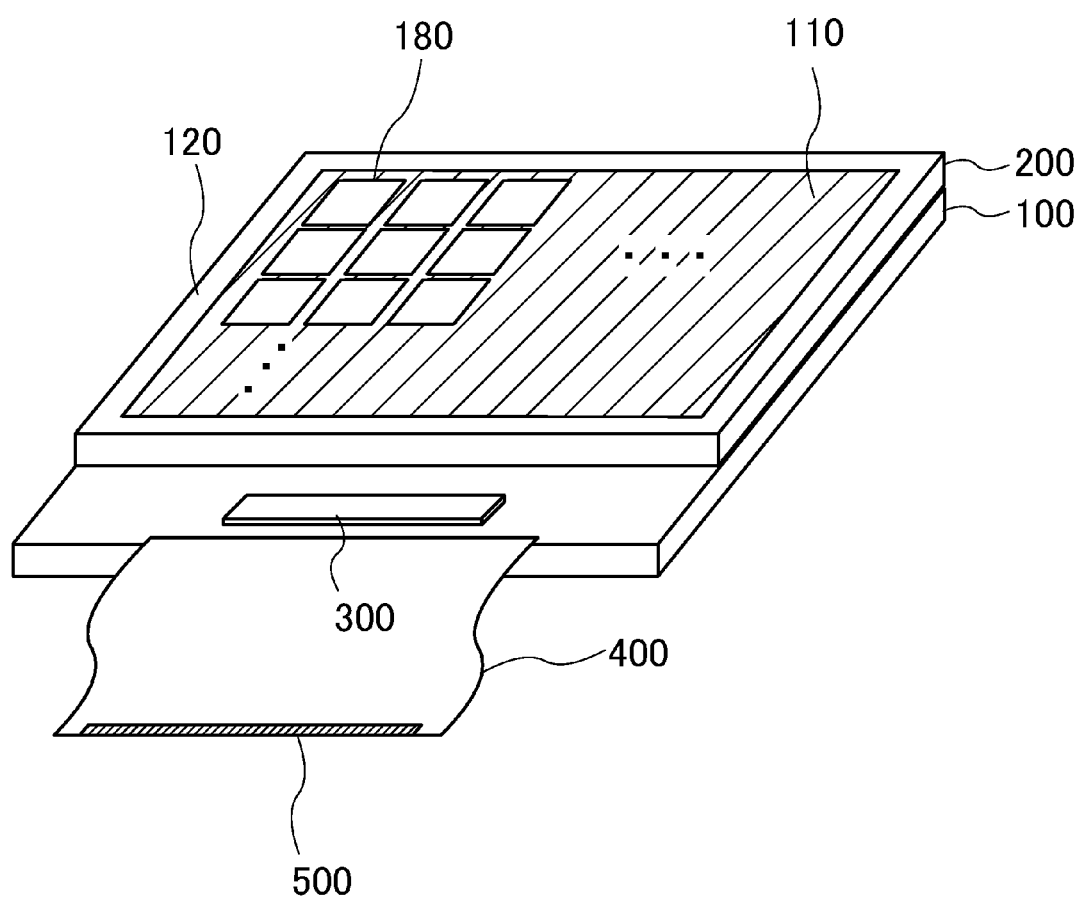
FIG. 8 is a diagram showing a perspective view of a display device in embodiment seven of the present invention.
Figure 9:
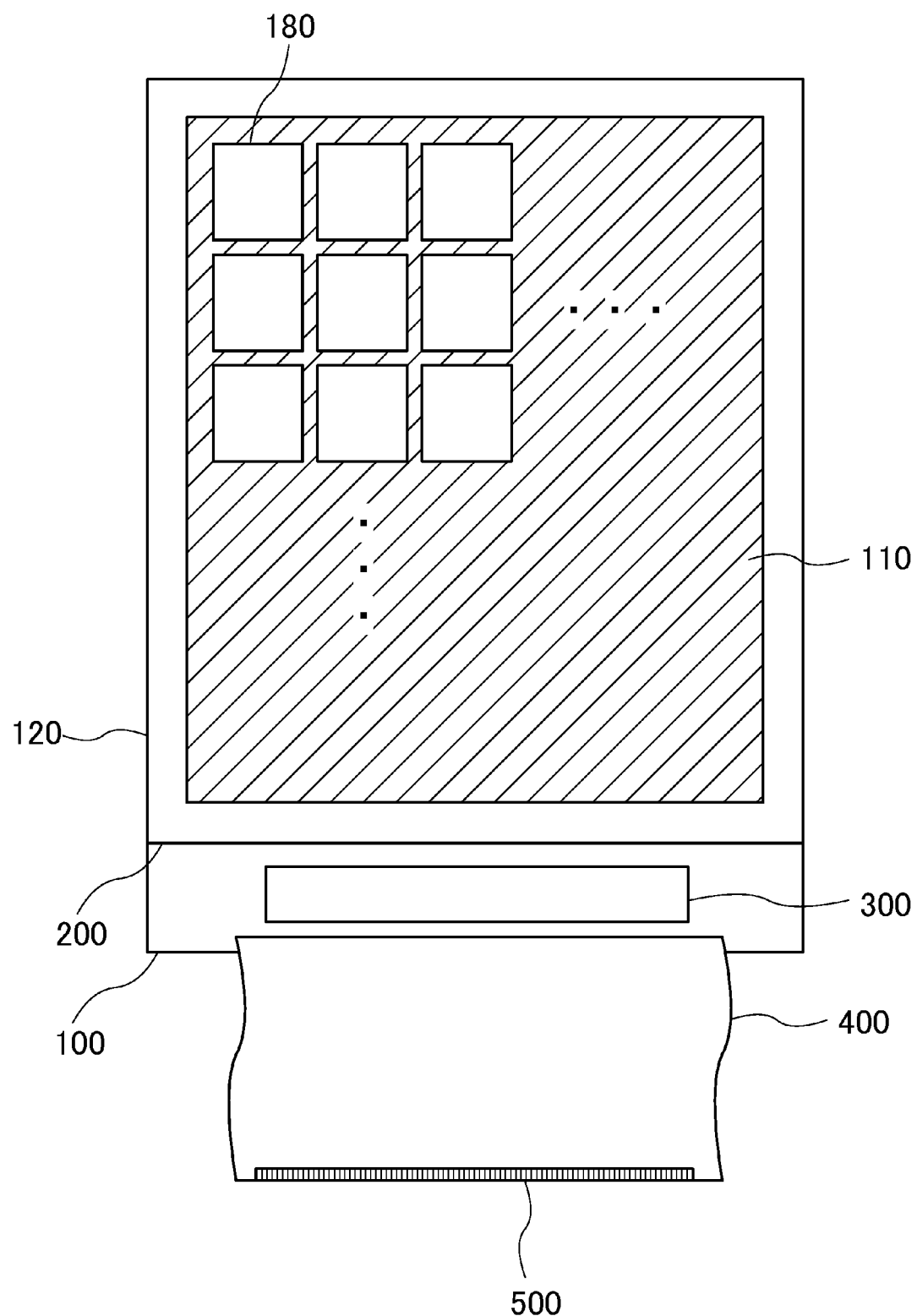
FIG. 9 is a diagram showing a planar view of a display device in in embodiment seven of the present invention.
Figure 10:
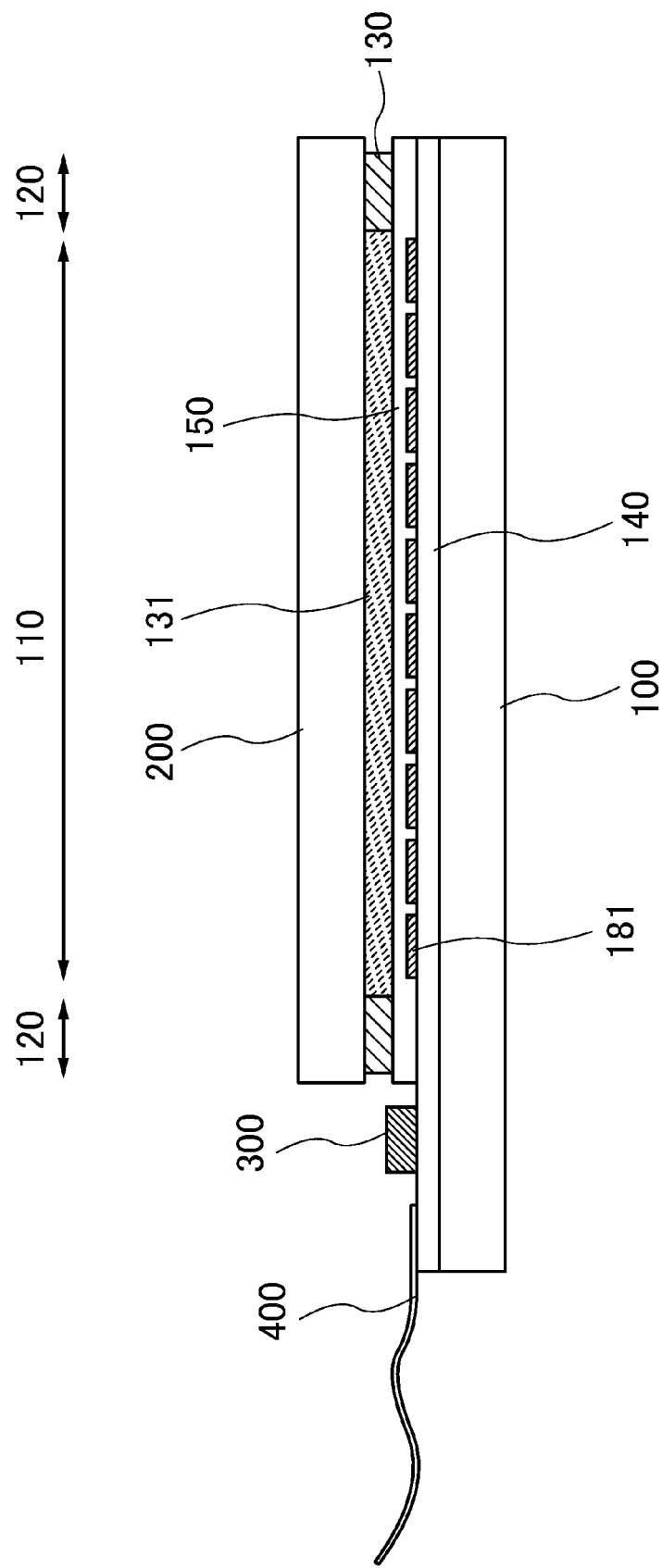
FIG. 10 is a diagram showing a cross-sectional structure of a display device in embodiment seven of the present invention.

First, a summary of a display device related to embodiment seven is explained using FIG. 8 to FIG. 10. FIG. 8 is a diagram showing a perspective view of a display device related to embodiment seven of the present invention. In addition, FIG. 9 is a diagram showing a planar view of a display device in embodiment seven in the present invention, and FIG. 10 is a diagram showing a cross-sectional view of a display device in embodiment seven of the present invention.

As is shown in FIG. 8 and FIG. 9, the display device in embodiment seven includes a substrate 100 including a light emitting element on each of a plurality of pixels and a display region 110 arranged with the pixels 180 in a matrix shape, an opposing substrate 200 facing the substrate 100, a driver IC 300 arranged in a region where the substrate 100 is exposed from the opposing substrate 200 and FPC 400 (flexible printed circuit). The substrate 100 is divided into a display region 110 and a periphery region 120 located on the periphery of the display region 110. The pixels 180 are arranged in a matrix shape in the display region 110 in the substrate 100. In addition, the light emitting elements explained in embodiment one to embodiment six is arranged in each of the plurality of pixels 180. A terminal part 500 is arranged in the FPC 400 connected to a controller circuit which controls a drive circuit.

As is shown in FIG. 10, a transistor layer 140 is arranged above the substrate 100, and a light emitting element 181 arranged in each pixel is arranged above the transistor layer 140. The light emitting element 181 is covered by a sealing layer 150. The sealing layer 150 is removed in a region where the transistor layer 140 is exposed from the opposing substrate 200. The driver IC 300 and FPC 400 are crimped to wiring of the exposed transistor layer 140. The substrate 100 and opposing substrate 200 are bonded together in a seal material 130 arranged in a region corresponding to the periphery region 120. The seal material 130 is arranged continuously so as to enclose the display region 110 in the exterior periphery part of the periphery region 120. The region enclosed by the substrate 100, the opposing substrate 200 and seal material 130 is filled by a filler material 131.
(Pixel Structure)

Figure 11:
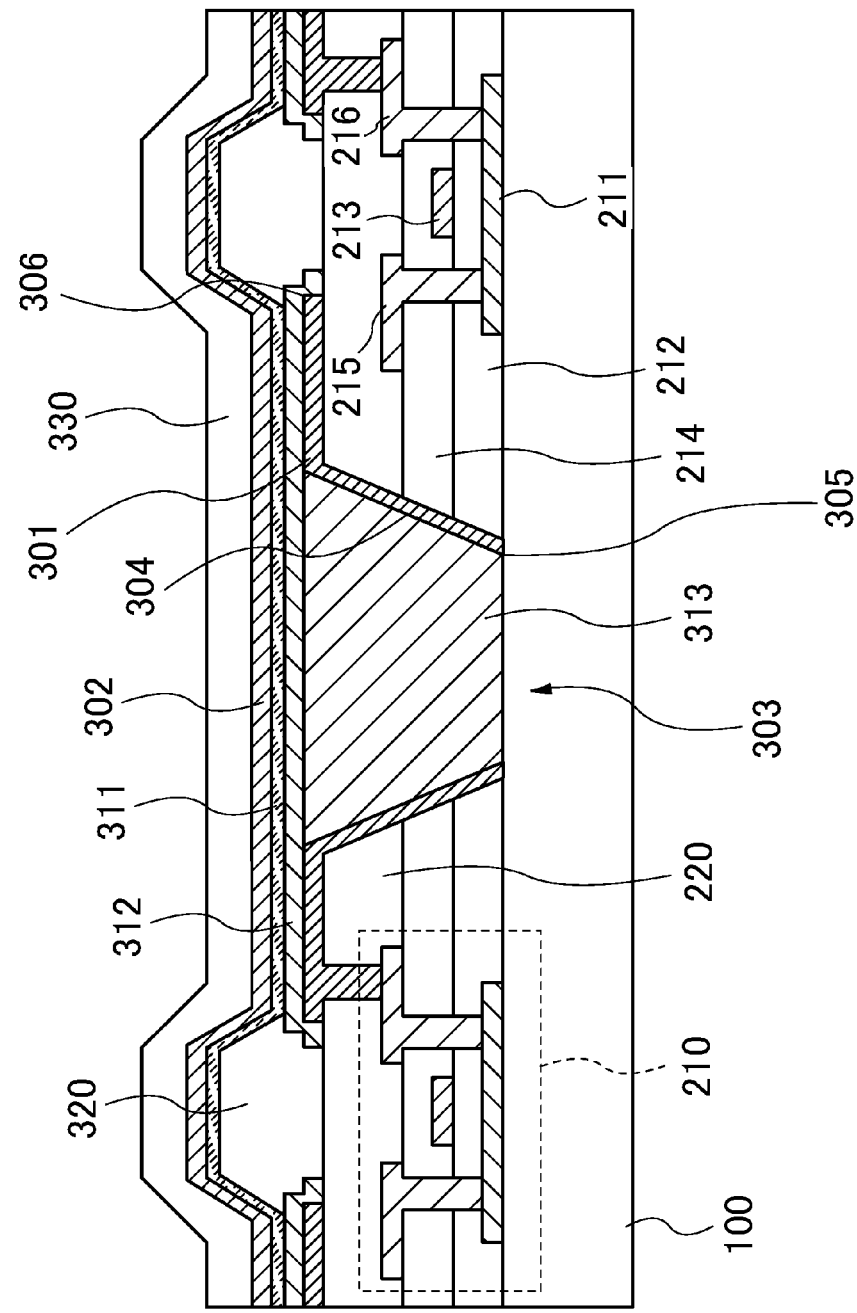
FIG. 11 is a diagram showing a cross-sectional structure of a pixel in a display device in embodiment seven of the present invention.

Next, a pixel of the display device related to embodiment seven is explained in detail using FIG. 11 to FIG. 18. FIG. 11 is a diagram showing a cross-sectional view of a pixel of the display device in embodiment seven of the present invention.

In FIG. 11, a top gate type transistor 210 is formed above the substrate 100. The transistor 210 includes a semiconductor 211, a gate insulation layer 212, a gate electrode 213, an interlayer insulation layer 214, a source electrode 215 and drain electrode 216. An interlayer resin layer 220 is formed above the transistor 210. An aperture part 303 including a slanted surface reaching the substrate 100 is arranged in each of the gate insulation layer 212, interlayer insulation layer 214 and interlayer resin layer 220 respectively. A reflection layer 301 which functions as part of an anode of a light emitting element is formed on the upper surface of the interlayer resin layer 220 and the slanted surface of the aperture 303. The reflection layer 301 formed on the slanted surface of the aperture part 303 includes a slanted surface 304. Although a structure in which the slanted surface 304 is arranged so as to correspond with a region of the aperture part 303 in FIG. 11, the present invention is not limited to this structure. The slanted surface 304 may also be arranged between at least an end part 305 in the aperture part 303 of the reflection layer 301 and an exterior periphery end part 306 of a pattern of the reflection layer 301. In addition, the reflection layer 301 is connected to the drain electrode 216 of the transistor 210 via an aperture part arranged in the interlayer resin layer 220.

A color filter 313 including a pigment layer is arranged in the aperture part 303. In FIG. 11, the color filter 313 is formed so as to fill the aperture part 303 and relieves a step formed by the aperture part 303. Here, the color filter 313 does not have to completely flatten the step formed by the aperture part 303 or may be formed so as to substantially ignore the effects of the step formed by the aperture part 303. As a result, in the light emitting region of a light emitting layer it is possible to roughly uniform the thickness of the light emitting layer between an anode and cathode.

A transparent conductive layer 312 which functions as a part of an anode of a light emitting element is formed above the reflection layer 301 and color filter 313. The transparent conductive layer 312 is formed so as to cover the periphery end part of the pattern of the reflection layer 301. In addition, an interval wall 320 is formed so as to cover an end part of the transparent conductive layer 312 above the transparent conductive layer 312. Each pixel is defined by the interval wall 320. Although the interval wall 320 is formed above the transistor 210 in FIG. 11, this positional relationship is for explaining a cross-sectional structure and does not always show an actual layout. That is, in a planar view the transistor 210 and interval wall 320 do not have to overlap.

A sealing layer 330 which seals so that water or impurities do not enter the light emitting layer 311, reflection layer 302 which functions as a part of the cathode of a light emitting element and the light emitting layer 311 are formed above the interval wall 320 and transparent conductive layer 312 which is exposed from the interval wall 320. The light emitting layer 311, reflection layer 302 and sealing layer 330 are formed in at least the display region 110.

Because the light emitting element explained in FIG. 11 uses the light source in embodiment four shown in FIG. 5, the reflection layer 301 corresponds to the reflection layer 101, the slanted surface 304 corresponds to the slanted surface 104, the color filter 313 corresponds to the resin layer 113, the transparent conductive layer 312 corresponds to the transparent conductive layer 112, the light emitting layer 311 corresponds to the light emitting layer 111 and the reflection layer 302 corresponds to the reflection layer 102.

As described above, according to the element structure shown in FIG. 11, light generated in the light emitting layer 311 is repeatedly reflected by the pair of reflection layers 301, 302 and the light which reaches the aperture part 303 is emitted to the exterior. Therefore, it is possible to use light in a display other than the light emitted to the exterior from the periphery of the pair of reflection layers 301, 302, and because there is no loss due to absorption by a shielding layer as in a conventional display, it is possible to improve light emitting efficiency. In addition, because the color filter 313 is arranged in the aperture part 303, it is possible to control the problem of mixed colors due to leaked light. Furthermore, because the reflection layer 301 includes a slanted surface 304 in the aperture part 303, it is possible to obtain a wide viewing angle.

Figure 12:
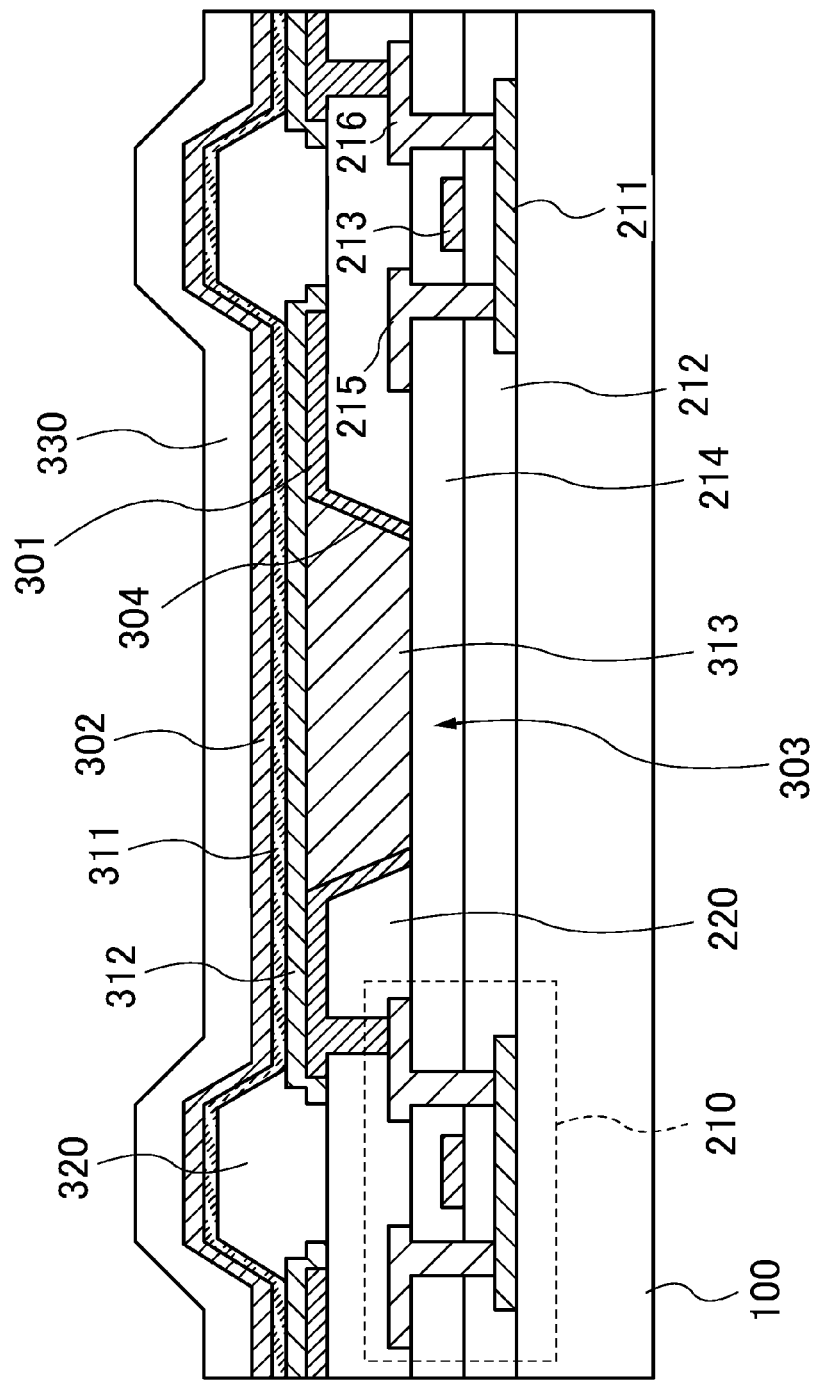
FIG. 12 is a diagram showing a cross-sectional structure of a pixel in a display device in a modified example one in embodiment seven of the present invention.

Next, a modified example one of embodiment seven is explained. FIG. 12 is a diagram showing a cross-sectional structure of a pixel in the display device in a modified example one of embodiment seven of the present invention. The different point in FIG. 11 is that the aperture part 303 is arranged only in the interlayer resin layer 220 and an aperture part is not arranged in the gate insulation layer 212 and interlayer insulation 214. That is, in the structure shown in FIG. 12 an inorganic insulation layer including the gate insulation layer 212 and interlayer insulation layer 214 is formed between the substrate 100 and the aperture part 303. In FIG. 12, although both inorganic insulation layers of the gate insulation layer 212 and interlayer insulation layer 214 are formed between the substrate 100 and aperture part 303, either a layer of the gate insulation layer 212 or the interlayer insulation layer 214 alone may be formed.

As described above, according to the element structure shown in FIG. 12, it is possible to form a thin color filter 313, and control the amount material of the color filter 313. As a result, it is possible to improve light emitting efficiency, control the problem of mixed colors, obtain a wide viewing angle and obtain the effect of reduced costs as in FIG. 11. In addition, because it is possible to adjust the thickness of the color filter using the thickness of the interlayer resin layer, it is possible to secure a desired color purity and control loss of light through a color filter. As a result, it is possible to improve light emitting efficiency.

Figure 13:
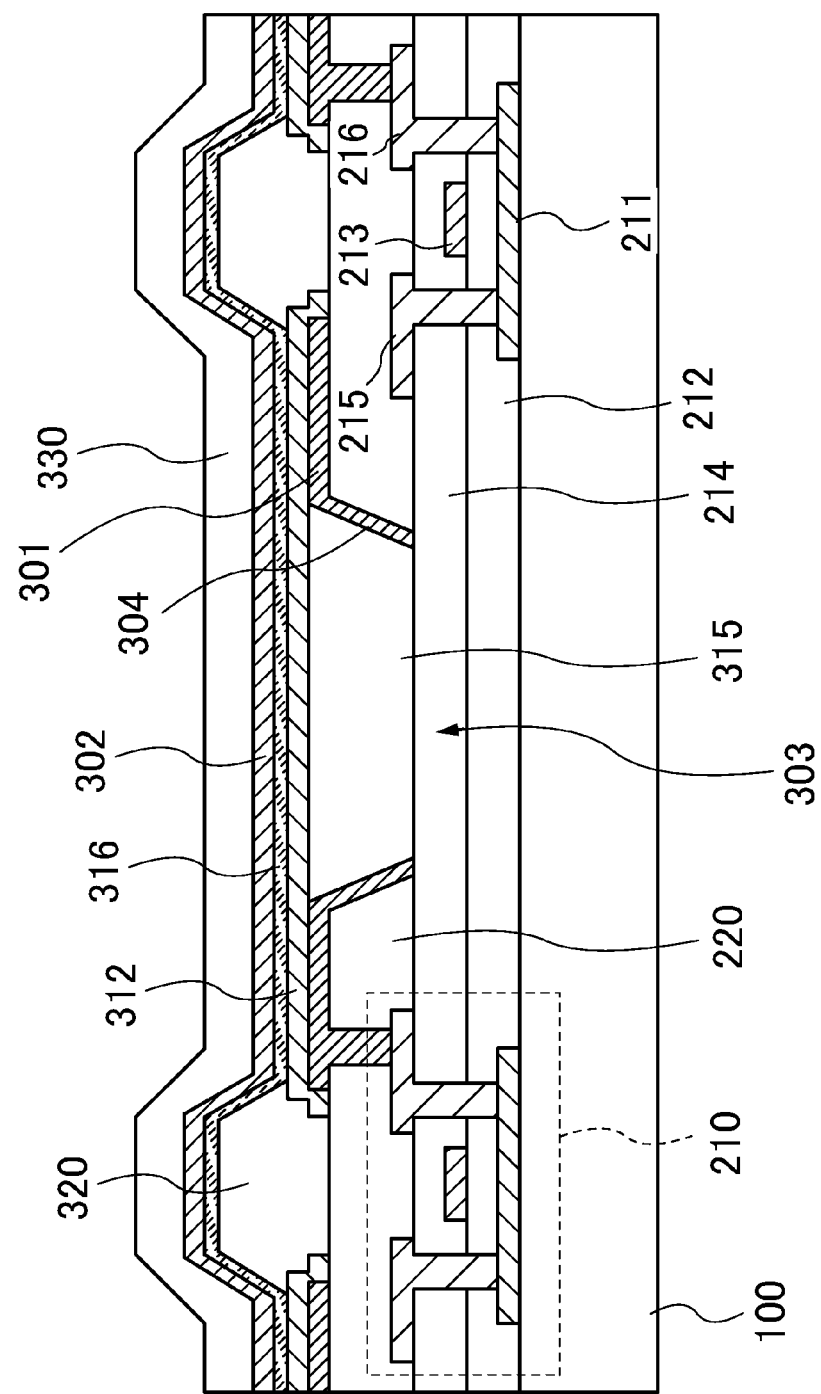
FIG. 13 is a diagram showing a cross-sectional structure of a pixel in a display device in a modified example two in embodiment seven of the present invention.

Next, a modified example two of embodiment seven is explained. FIG. 13 is a diagram showing a cross-sectional view of a pixel of a display device in a modified example two of embodiment seven. The different point from FIG. 12 is that a transparent resin layer 315 is formed instead of a color filter in the aperture part 303. In the case of the display device shown in FIG. 13, it is preferred to use a material that emits light in the wavelengths of RGB as the light emitting layer 316. In addition, the thickness of the transparent resin layer 315 may be adjusted in order to obtain the resonance effect of the wavelength of each of RGB, that is, microcavity effects. Adjustment of the thickness of the transparent resin layer 315 may be performed by adjusting the amount of the transparent resin layer 315 that is coated or by adjusting the thickness of the interlayer resin layer 220. In addition, the thickness of the transparent resin layer 315 may be adjusted by exposing using a multi-gradation mask after uniformly coating the transparent resin layer 315 on the entire surface. It is preferred to change the thickness of the interlayer resin layer 220 according to each RGB pixel in order to obtain the microcavity effects.

As described above, according to the element structure shown in FIG. 13, it is possible to control the amount of material of the transparent resin layer 315 used. As a result, it is possible to improve light emitting efficiency, suppress the problem of mixed colors, obtain a wide viewing angle and obtain the effects of cost reduction the same as FIG. 11. In addition, it is possible to further increase color purity using the effects of microcavity.

Although the case where light is generated of a wavelength of either RGB by a light emitting layer was explained in FIG. 13, the present invention is not limited to this, the light emitting layer may also be an element that emits white color. In this case, a color filter may be arranged between the aperture part 303 and the interlayer insulation layer 214. In addition, a color filter may be arranged so as to sandwich any interface of a plurality of layers arranged between the substrate 100 and aperture part 303. In addition, a color filter may be arranged on the opposite surface (rear surface) of the surface on which the transistor 210 of the substrate 100 is formed without arranging a color filter between the aperture part 303 and substrate 100.

Figure 14:
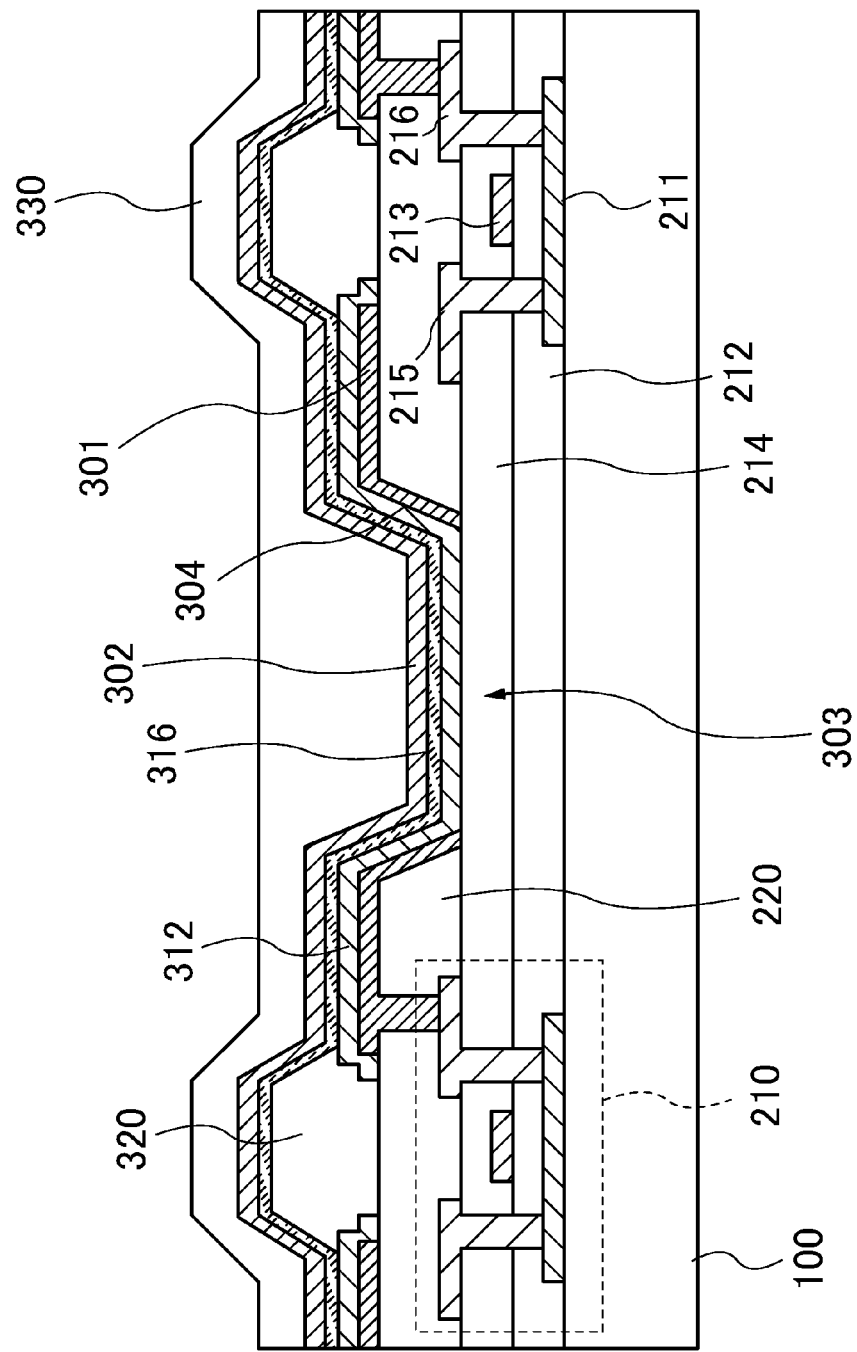
FIG. 14 is a diagram showing a cross-sectional structure of a pixel in a display device in a modified example three in embodiment seven of the present invention.

Next, a modified example three of embodiment seven is explained. FIG. 14 is a diagram showing a cross-sectional view of a pixel of a display device in a modified example three of embodiment seven. The different point to FIG. 13 is that the transparent resin layer 315 is not formed in the aperture part 303 but the transparent conductive layer 312, light emitting layer 316 and reflection layer 302 are formed along the bottom part of the aperture part 303 and slanted surface 304. In this case of this structure, because the light emitting layer 316 is formed above the slanted surface 304, the overall area of the light emitting layer 316 becomes larger compared to FIG. 12. In addition, in the case of this structure, it is preferred to use a material that emits light at a wavelength of each of RGB as the light emitting layer 316.

As described above, according to the element structure shown in the FIG. 14, because it is possible to increase the overall area of the light emitting layer 316, it is possible to strengthen light emitting intensity without expanding the size of the light emitting element. In addition, there is no need to form a color filter or transparent resin layer as in FIG. 11 to FIG. 13. Therefore, it is possible to not only reduce the amount cost of these materials but also reduce the coating process of these materials. As a result, it is possible to improve light emitting efficiency, suppress the problem of mixed colors, obtain a wide viewing angle and obtain the effect of a reduction in costs the same as FIG. 11.

Figure 15:
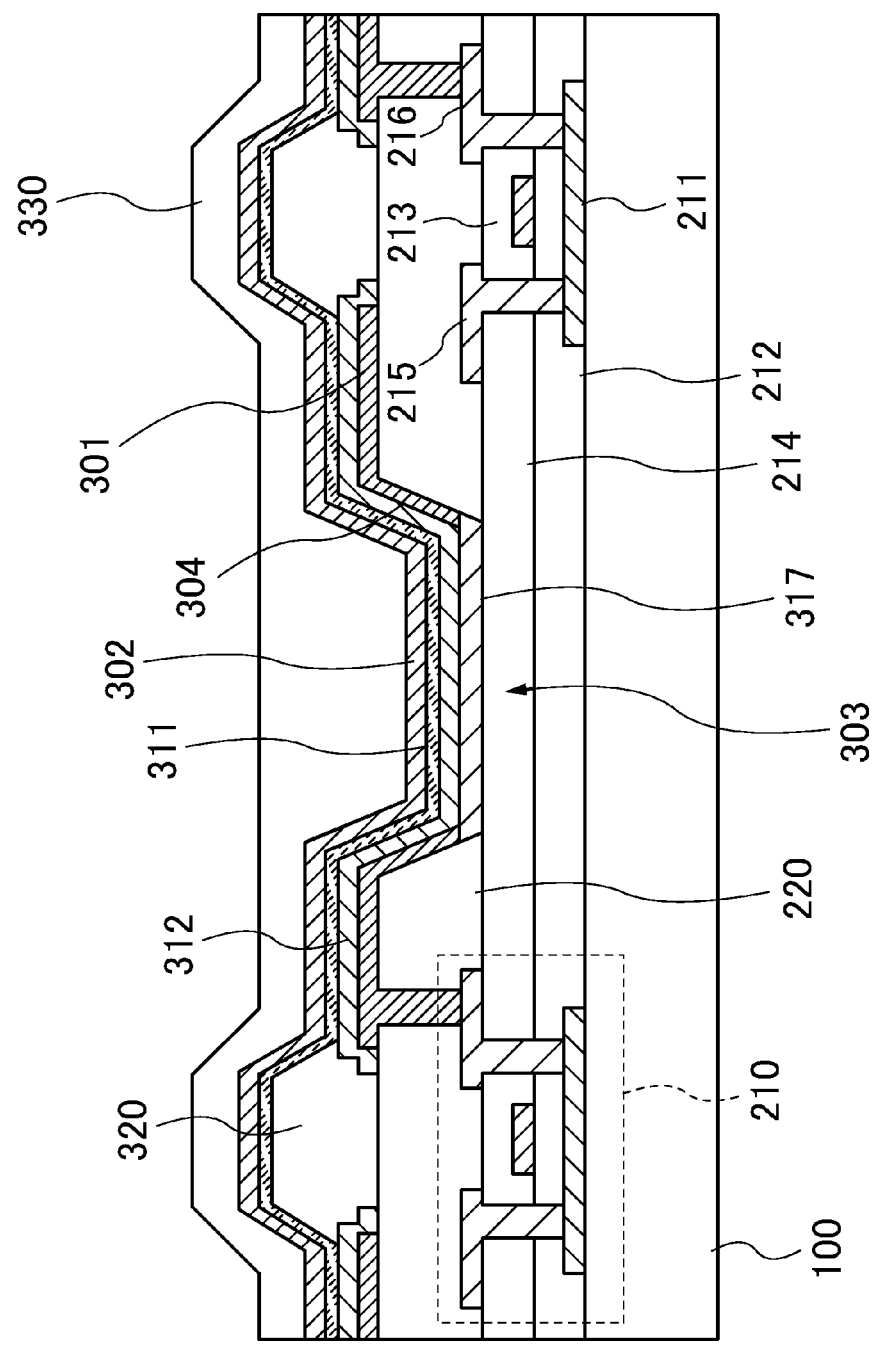
FIG. 15 is a diagram showing a cross-sectional structure of a pixel in a display device in a modified example four in embodiment seven of the present invention.

Next, a modified example four of embodiment seven is explained. FIG. 15 is a diagram showing a cross-sectional view of a pixel of a display device in a modified example four of embodiment seven. The different point to FIG. 14 is that the end part of the aperture part 303 which is the aperture from which light generated in the light emitting layer 311 is emitted is covered by the color filter 317. Although a structure in which the aperture part 303 is covered completely by the color filter 317 in FIG. 15, the present invention is not limited to this structure. Another layer may be sandwiched in between the aperture part 303 and color filter 317. In addition, a color filter may be arranged on the rear surface of the substrate 100 so as to correspond to the aperture part 303.

As is described above, according to the element structure shown in FIG. 15, because it is possible to increase the overall area of the light emitting layer 311 even in a white light emitting element and color filter type structure, it is possible to strengthen light emitting intensity without expanding the size of a light emitting element. In addition, the amount of color material used is less compared to FIG. 11 or FIG. 12. Therefore, it is possible to suppress the amount of these materials used. As a result, it is possible to improve light emitting efficiency, suppress the problem of mixed colors, obtain a wide viewing angle and obtain the effect of a reduction in costs the same as FIG. 11.

Figure 16:
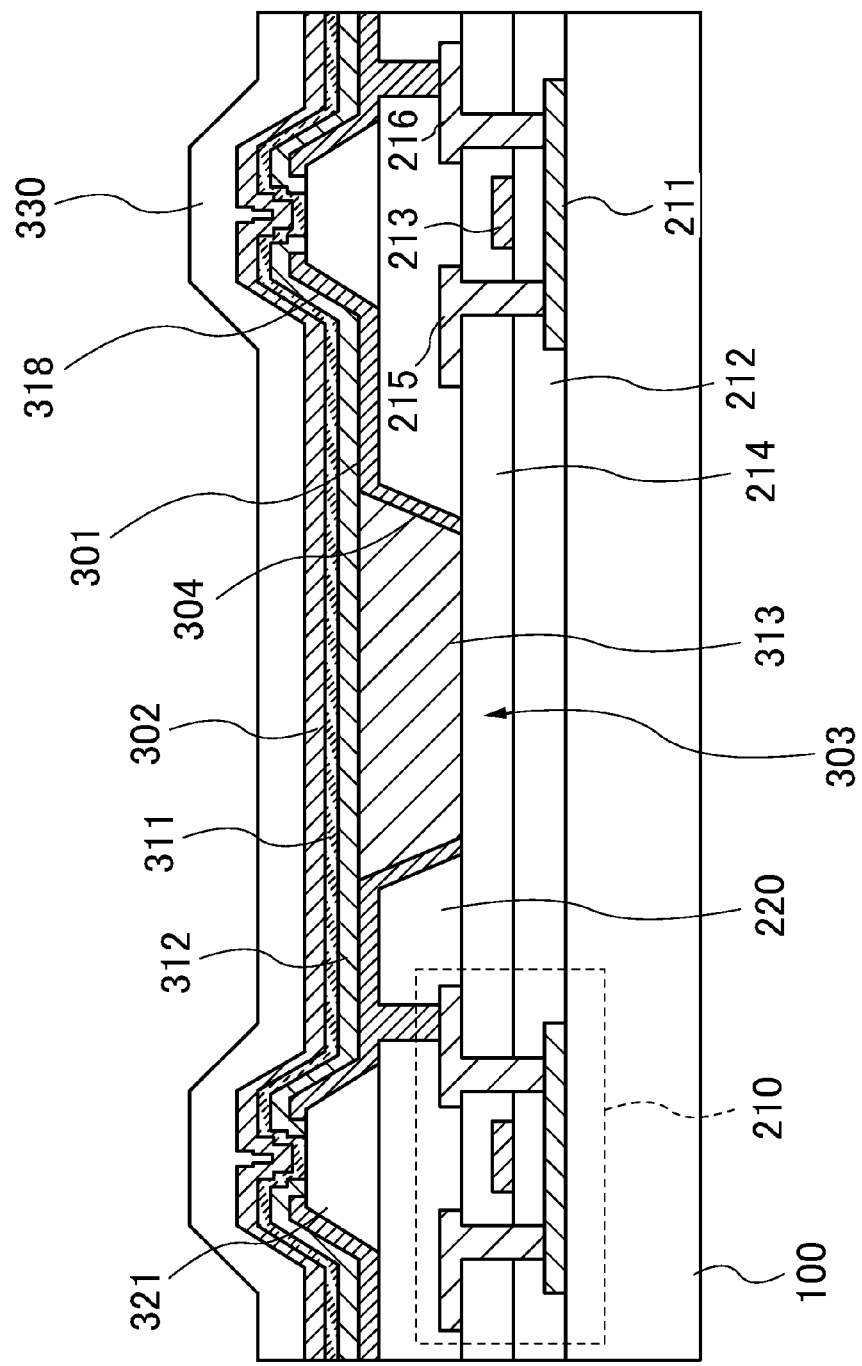
FIG. 16 is a diagram showing a cross-sectional structure of a pixel in a display device in a modified example five in embodiment seven of the present invention.

Next, a modified example five of embodiment seven is explained. FIG. 16 is a diagram showing a cross-sectional diagram of a pixel of a display device in a modified example five of embodiment seven. The different point from FIG. 12 is that the interval wall 321 including a slanted surface is formed on a lower layer of the lower part reflection layer 301 and the reflection layer 301 formed on the slanted surface of the interval wall 321 includes a slanted surface 318. Although a structure in which a slanted surface 318 is formed by the interval wall 321 arranged on the exterior periphery end part of a pattern of the reflection layer 301 is shown in FIG. 16, the present invention is not limited to this structure. The invention may also include another slanted surface 318 further to the exterior periphery than at least the slanted surface 304.

Because the display device explained in FIG. 16 uses the light emitting element of embodiment six shown in FIG. 7A, the reflection layer 301 corresponds to the reflection layer 101, the slanted surface 304 corresponds to the slanted surface 104, the other slanted surface 318 corresponds to the slanted surface 105, the color filter 313 corresponds to the resin layer 113, the transparent conductive layer 312 corresponds to the transparent conductive layer 112, the light emitting layer 311 corresponds to the light emitting layer 111 and the reflection layer 302 corresponds to the reflection layer 102.

By adopting the structure shown in FIG. 16, a part of the light which proceeds in the exterior direction which is different to the aperture part 303 among the light generated by the light emitting layer 311, is reflected by the slanted surface 318 and proceeds in the direction of the aperture part 303. That is, by including the slanted surface 318 on the reflection layer 301 further to the exterior than the slanted surface 304, it is possible to reduce the light which is emitted to the exterior from the exterior periphery of the pair of reflection layers 301, 302.

As described above, according to the element structure shown in FIG. 16, because it is possible to suppress leaked light which is emitted to the exterior from the exterior periphery of the pair of reflection layers 301, 302, it is possible to use light generated in the light emitting layer 311 more efficiently in a display. As a result, it is possible to improve light emitting efficiency similar to FIG. 11, suppress the problems of mixed colors and obtain the effect of a wider viewing angle.

Figure 17:
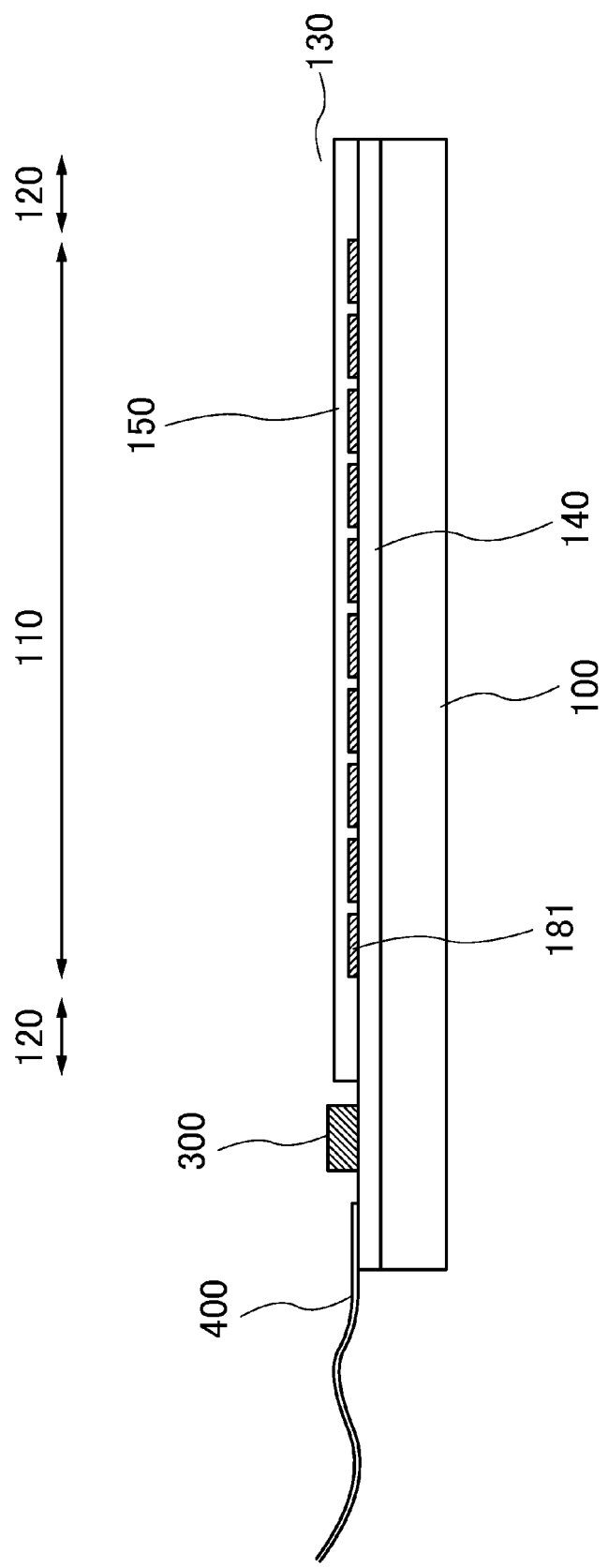
FIG. 17 is a diagram showing a cross-sectional structure of a pixel in a display device in a modified example six in embodiment seven of the present invention.

FIG. 17 is a diagram showing a cross-sectional view of a display device in a modified example of embodiment seven of the present invention. If degradation of the light emitting element arranged in a pixel is sufficiently suppressed by the sealing layer 150, it is sufficient that the sealing layer 150 cover the light emitting element 181 as is shown in FIG. 17, and it is possible to adopt a structure in which the opposing substrate 200, sealing material 130 and filler material 131 are not arranged. The sealing layer 150 may be an inorganic material or an organic material. In addition, these may have a stacked layer structure.

Figure 18:
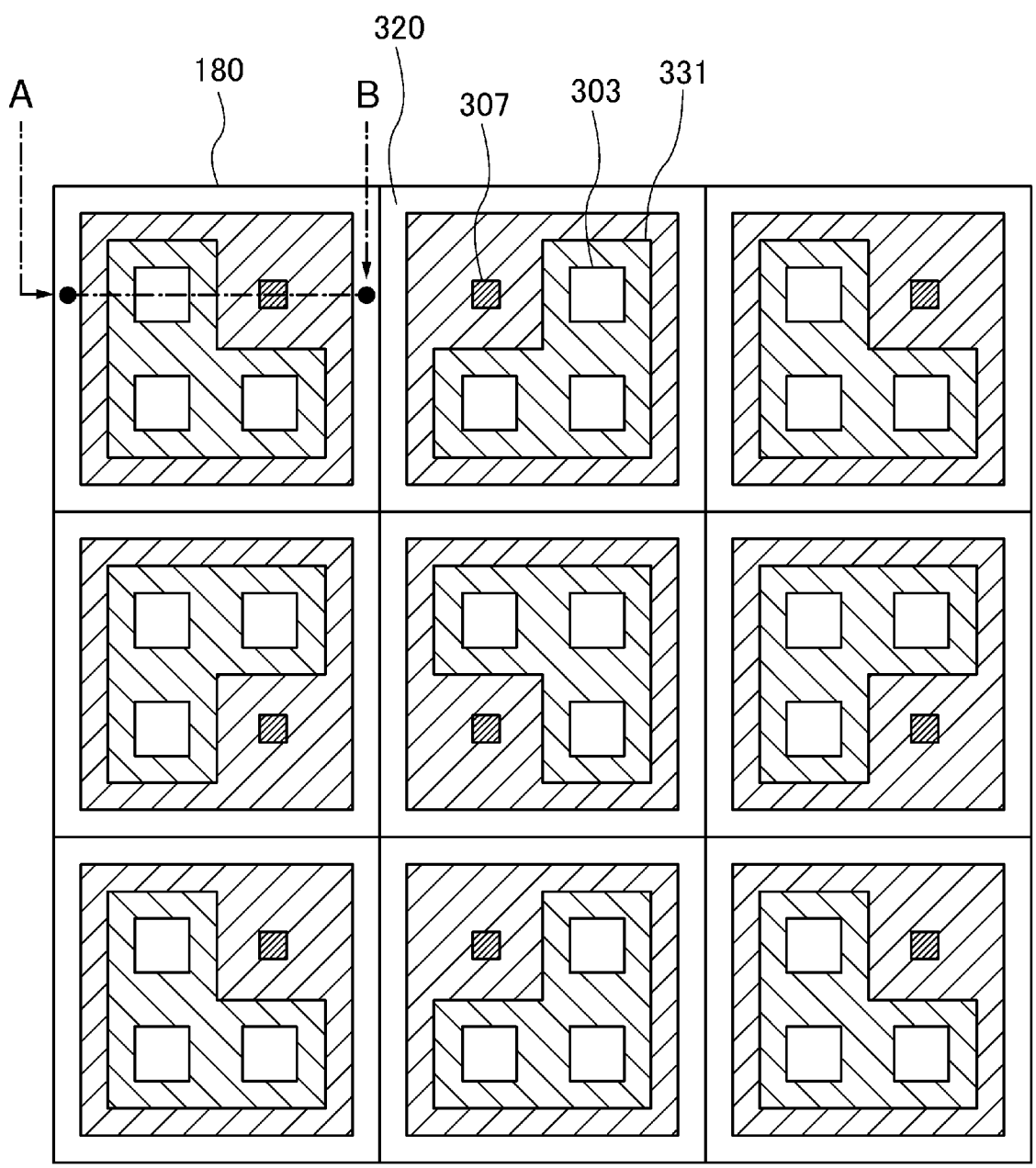
FIG. 18 is a diagram showing a planar view of a pixel in a display device in embodiment eight of the present invention.
Figure 19:
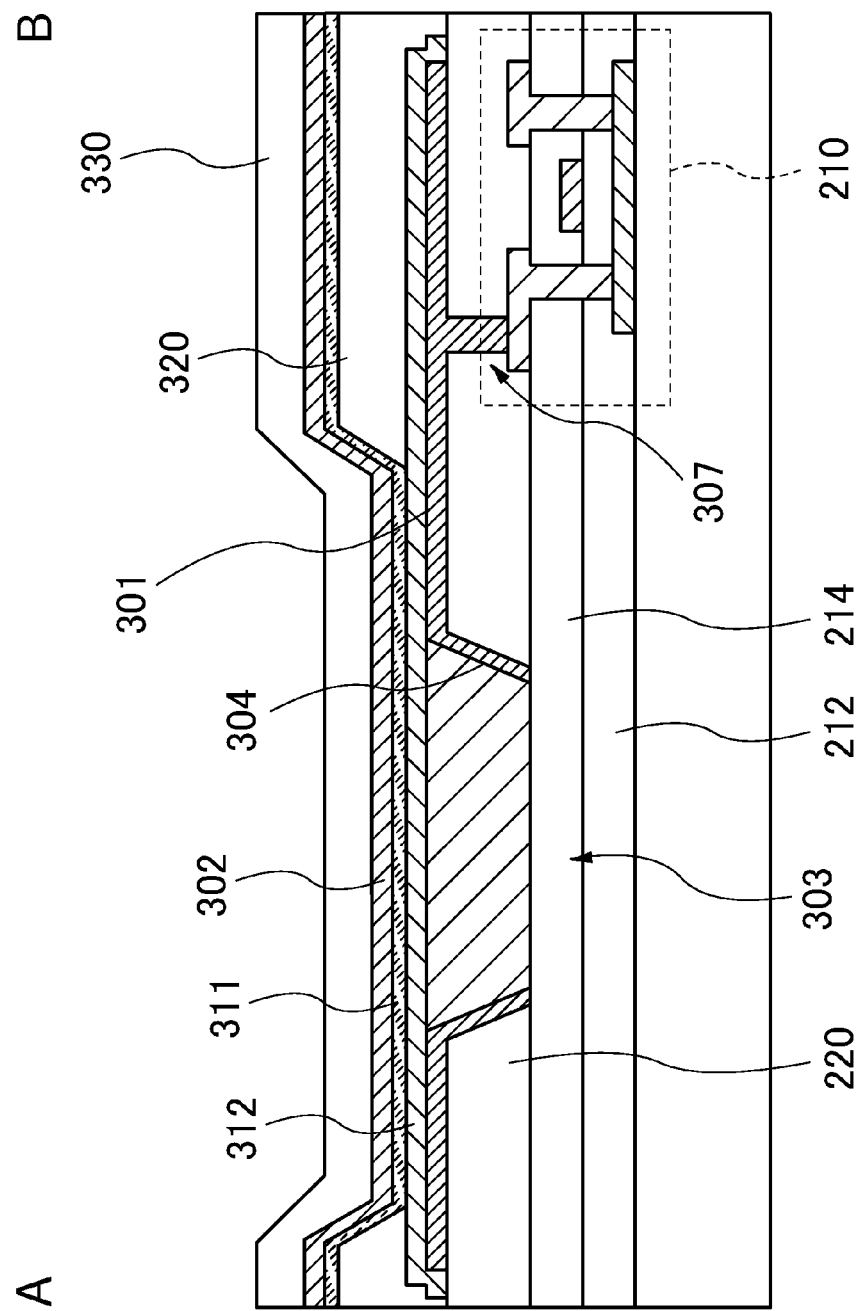
FIG. 19 is a diagram showing a cross-sectional structure along the line A-B in a pixel in a display device in embodiment eight of the present invention.

Next, the relationship between the layout of a pixel in a display device and a cross-sectional structure is explained using FIG. 18 and FIG. 19. FIG. 18 is a diagram which shows a planar view of a pixel in the display device in embodiment eight of the present invention. The light emitting element structure of embodiment eight is the same as the modified example one of embodiment seven. In addition, FIG. 19 is a diagram showing a cross-sectional view of the line A-B of a pixel in the display device in embodiment eight of the present invention.

In FIG. 18, the edge region of each pixel 180 is defined by the interval wall 320. That is, the end part of the reflection layer 301 and transparent conductive layer 312 is covered by the interval wall 320. In addition, the aperture region 331 which is open in an L shape is arranged in the interval wall 320. In addition, the aperture part 303 is arranged at three sections within the aperture region 331. In addition, a drain electrode of the transistor 210 of the pixel circuit shown in FIG. 19 is connected with the transparent conductive layer 312 which is a pixel electrode via the reflection layer 301 arranged in a contact 307.

Because the cross-sectional structure of a light emitting element shown in FIG. 19 is almost the same as that in FIG. 12, a detailed explanation is omitted here. Although a structure in which the transistor 210 is arranged so as to overlap a region of the interval wall 320 is shown in FIG. 19, the present invention is not limited to this structure. The transistor 210 can be freely arranged if it does not overlap the aperture part 303. That is, even if the number of transistors which drive a pixel circuit is increased, if a transistor is arranged so that it does not overlap the aperture part 303, light emitting efficiency is never decreased. Here, as in embodiment five shown in FIG. 6, the slanted surface 304 in each part has a different slanted angle in a plurality of aperture parts 303 included in one pixel.

Figure 20:
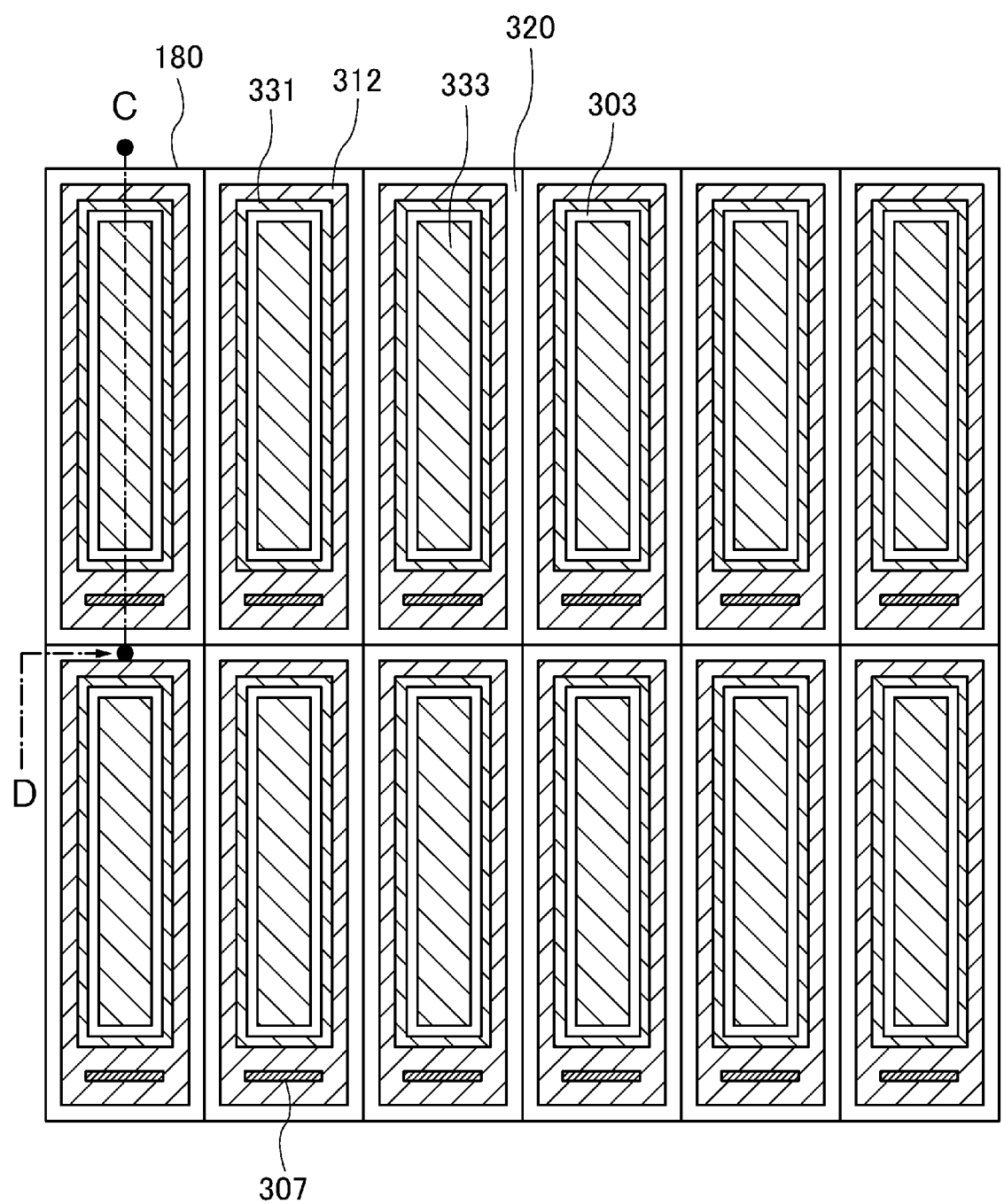
FIG. 20 is a diagram showing a planar view of a pixel in a display device in a modified example in embodiment eight of the present invention.
Figure 21:
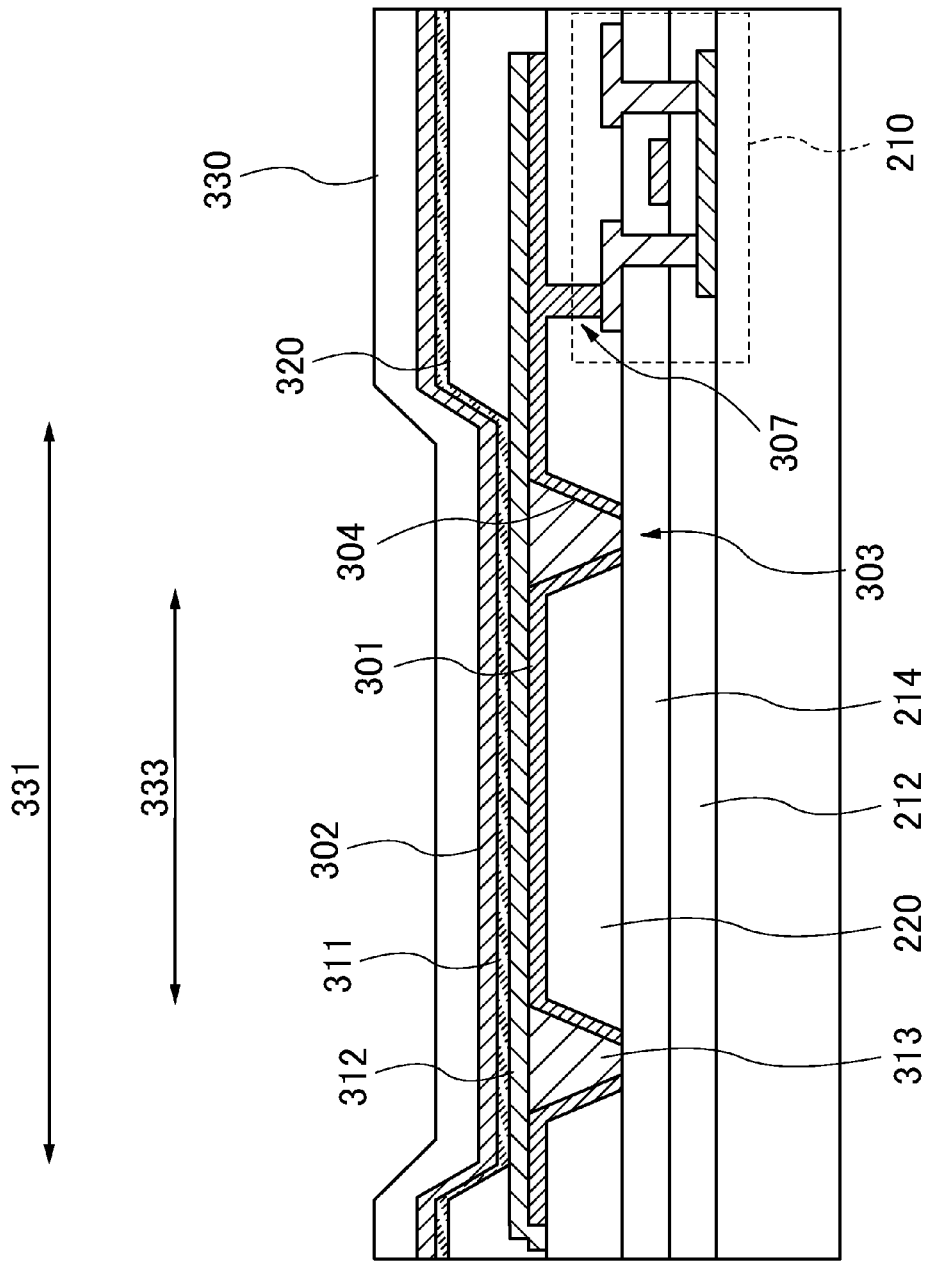
FIG. 21 is a diagram showing a cross-sectional structure along the line C-D of a pixel in a display device in a modified example in embodiment eight of the present invention.

Next, a pixel with a different layout to that in FIG. 18 is explained using FIG. 20 and FIG. 21. FIG. 20 is a diagram showing a planar view of a pixel of a display device in a modified example of embodiment eight of the present invention. In addition, FIG. 21 is a diagram showing a cross-sectional view of the line C-D of a pixel in the display device of a modified example of embodiment eight of the present invention.

The pixel shown in FIG. 20 is a rectangle which stretches in one direction. In addition, similar to FIG. 18, the edge region of each pixel 180 is defined by the interval wall 320. That is, the end part of the reflection layer 301 and transparent conductive layer 312 is covered by the interval wall 320. In addition, the aperture part 303 is formed along the exterior edge of the aperture region 331 within the aperture region 331 of the interval wall 320, and an interior aperture region 333 is formed therein. In addition, a drain electrode of the transistor 210 of the pixel circuit shown in FIG. 21 is connected with the transparent conductive layer 312 which is a pixel electrode via the reflection layer 301 arranged in the contact 307.

Because the cross-sectional structure of the light emitting element shown in FIG. 21 is almost the same as that in FIG. 12, a detailed explanation is omitted here. Although a structure in which the transistor 210 is arranged so as to overlap a region of the interval wall 320 is shown in FIG. 21, the present invention is not limited to this structure. The transistor 210 can be freely arranged if it does not overlap the aperture part 303. That is, even if the number of transistors which drive a pixel circuit is increased, if a transistor is arranged so that it does not overlap the aperture part 303, light emitting efficiency is never decreased.

According to the light emitting element shown in FIG. 20 and FIG. 21, because the interior aperture region 333 is enclosed by the aperture part 303, light which is generated in the interior aperture region 333 is emitted to the exterior from the aperture part 303 at a high probability. As a result, it is possible to increase light emitting efficiency. In addition, because the interior aperture region 333 is a region where light is not emitted, it is possible to arrange an element such as a transistor or wiring. Here, among the aperture parts 303 formed along the rectangular shape, a slanted angle may be included with a different slanted surface 304 at each edge.

(Manufacturing Method)

Next, a manufacturing method of the display device related to the present invention is explained using FIG. 22 to FIG. 31. Here, the manufacturing method of the display device including the light emitting element of embodiment seven shown in FIG. 11 is explained.

Figure 22:
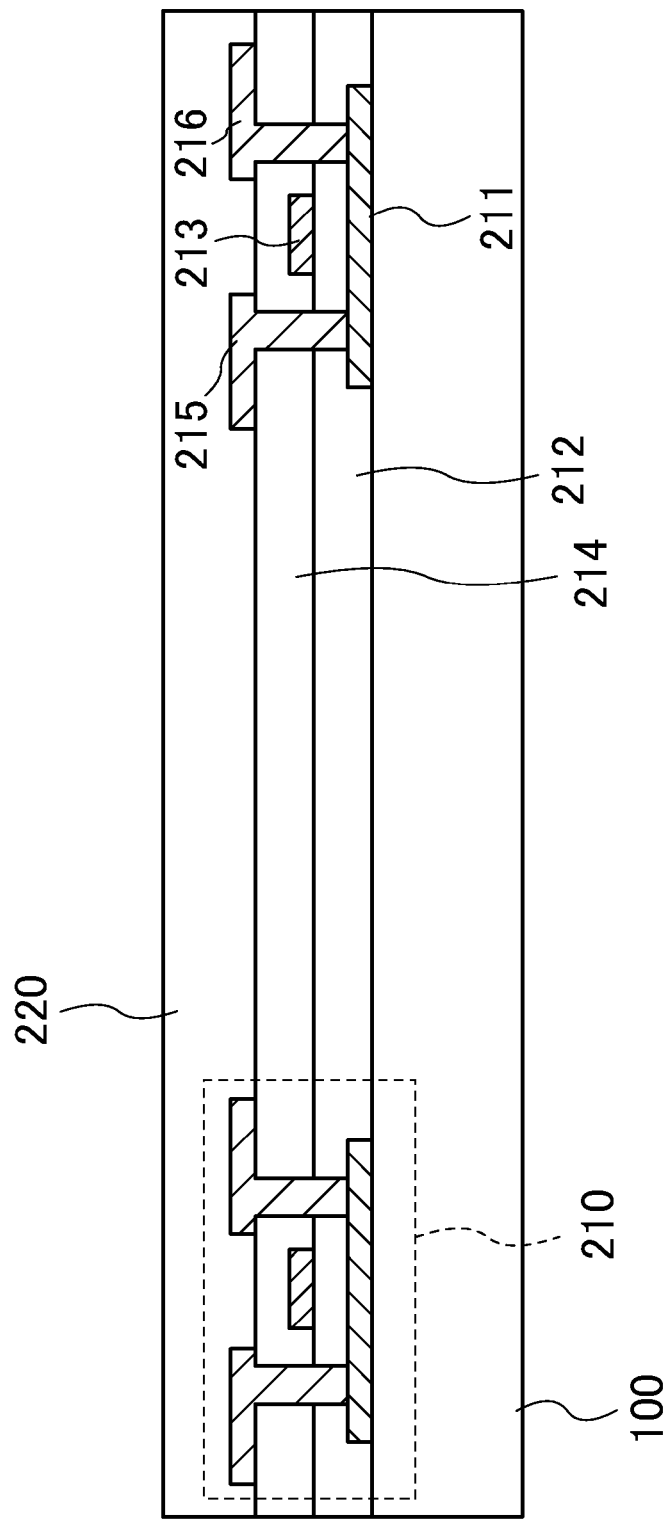
FIG. 22 is a diagram showing a process for forming a transistor layer in a manufacturing method of a display device in embodiment seven of the present invention.

FIG. 22 is a diagram showing a process for forming a transistor layer in a manufacturing method of the display device in embodiment seven of the present invention. FIG. 22 shows a state in which the transistor 210 is formed, the interlayer resin layer 220 is formed above the transistor 210 and the surface of the interlayer resin layer 220 is then flattened. The transistor 210 may be manufactured by a general top gate type transistor manufacturing method and here a detailed explanation is omitted. Here, although a top gate type transistor is explained as an example of embodiment seven, the present invention is not limited to this structure, a bottom gate type transistor may also be used.

Figure 23:
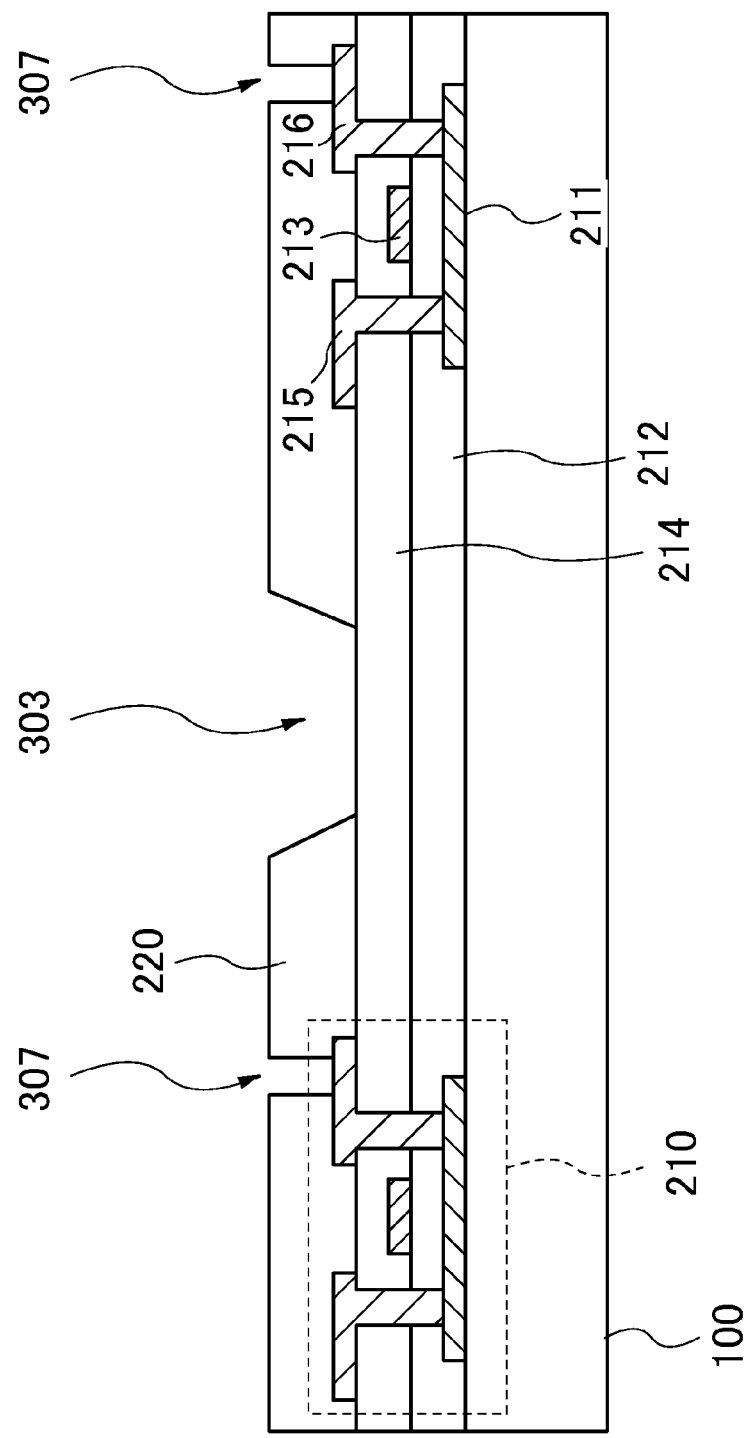
FIG. 23 is a diagram showing a process for forming an aperture part in an interlayer resin layer in a manufacturing method of a display device in embodiment seven of the present invention.

FIG. 23 is a diagram showing a process for forming an aperture part in an interlayer resin layer in a manufacturing method of a display device in embodiment seven of the present invention. An aperture of the interlayer resin layer 220 is formed by exposing a photosensitive resin using a general photo-mask. Here, a positive type photosensitive resin in which the exposed parts are dissolved and the unexposed parts are left is used. Regions in which an aperture is desired to be formed are exposed using a photomask and the photosensitive resin is removed by a development process. Here, because the shape and angle of the slanted surface of the aperture end part of the interlayer resin layer 220 determines the subsequent angle of the slanted surface of a reflection layer, it is preferred to adjust the exposure time and development conditions according to the desired specifications. Using the process described above, it is possible to obtain the aperture part 303 and the contact 307 which exposes the drain electrode 216 of the transistor 210 as is shown in FIG. 23.

Figure 24:
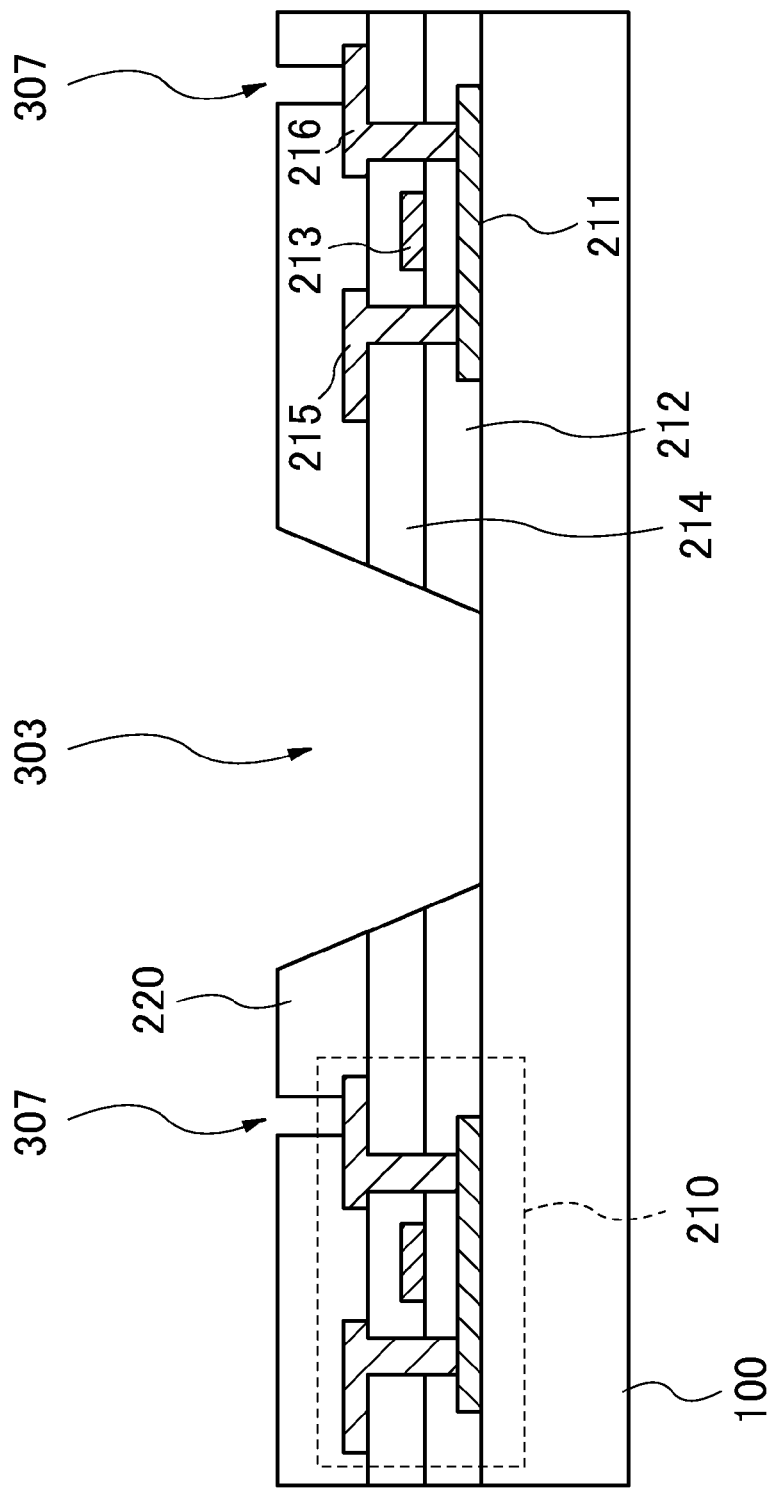
FIG. 24 is a diagram showing a process for forming an aperture part in an inorganic layer in a manufacturing method of a display device in embodiment seven of the present invention.

FIG. 24 is a diagram showing a process for forming an aperture part in an inorganic layer in a manufacturing process of a display device in embodiment seven of the present invention. Here, an aperture part is formed in the interlayer insulation layer 214 and the gate insulation layer 212 which are inorganic layers. The aperture part 303 is formed in an inorganic layer by dry etching using the interlayer insulation layer 220 formed with the aperture part 303 in FIG. 23 as a mask. At this time, the shape and angle of the slanted surface of an aperture part of an inorganic layer reflects the shape and angle of the slanted surface of the aperture part of the interlayer resin layer 220.

Here, in the case where the aperture part 303 is formed by dry etching, it is possible to adjust the slanting angle of the slanted surface formed in an inorganic layer by a selective ratio in the dry etching rate between the interlayer resin layer 220 and an inorganic layer below the interlayer resin layer 220. For example, in the case where the etching rate of the interlayer resin layer 220 with respect to an inorganic layer is fast, because the interlayer resin layer 220 is etched back while an inorganic layer is etched and the aperture size becomes large, the slanted angle of a slanted surface formed in an inorganic layer as a result becomes small.

Figure 25:
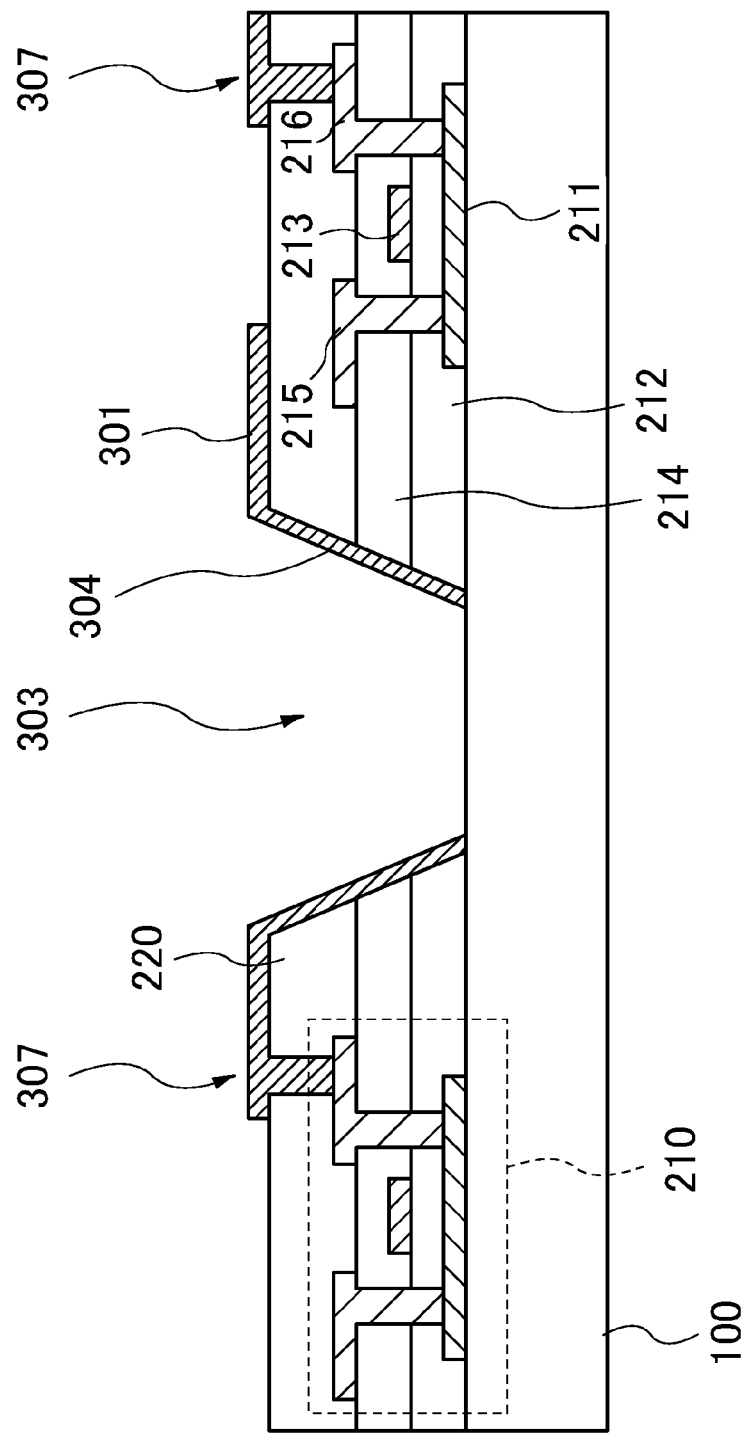
FIG. 25 is a diagram showing a process for forming a reflection layer which becomes an anode of a light emitting layer in a manufacturing method of a display device in embodiment seven of the present invention.

FIG. 25 is a diagram showing a process for forming a reflection layer which becomes an anode of a light emitting layer in a manufacturing method of a display device in embodiment seven of the present invention. It is preferred that a material with a high reflectance be selected as the reflection layer 301, for example, it is possible to use aluminum, titanium, molybdenum, chrome, nickel, silver or an alloy of these. The reflection layer 301 is formed on the contact 307 which exposes the drain electrode of a transistor and the entire surface including the aperture 303.

After forming the reflection layer 301 in the entire surface, the parts of the reflection layer pattern which are desired to remain are covered with a resist and the other parts are etched. The etching method can be appropriately selected according to the material of the pixel electrode. For example, it is possible to use wet etching with an etchant based on phosphorous acid or acetic acid with respect to aluminum. In addition, it is possible to use dry etching using chlorine gas or fluorine gas with respect to titanium. In either method, it is preferred to use perform processing using an etching method with a large selectivity ratio with the lower layer of the reflection layer.

Figure 26:
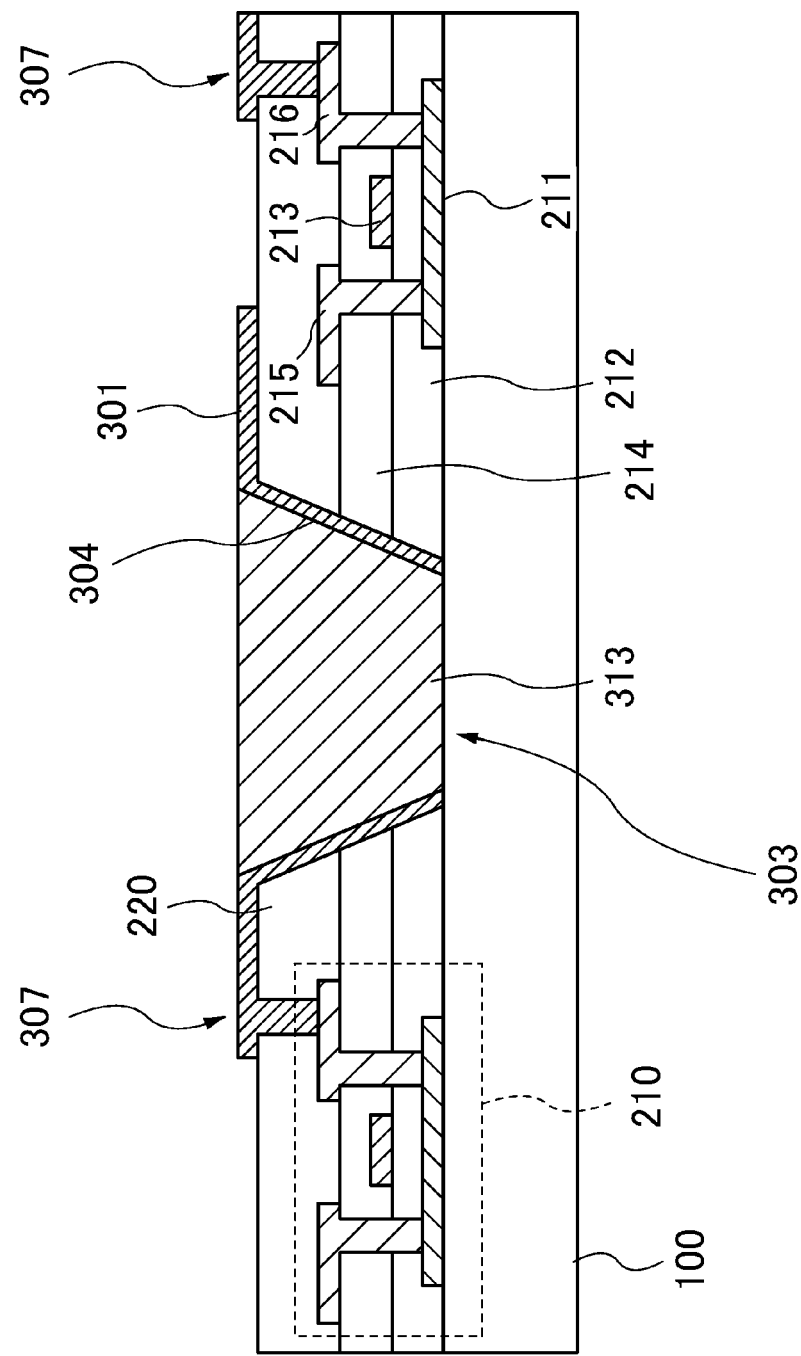
FIG. 26 is a diagram showing a process for forming a color filter in an aperture part in a manufacturing method of a display device in embodiment seven of the present invention.

FIG. 26 is a diagram showing a process for forming a color filter in an aperture part in a manufacturing method of a display device in embodiment seven of the present invention. After coating a photosensitive material on the entire surface of a substrate using a spin coat method etc, the sections where the color filter is desired to remain or the sections to be removed are exposed using a mask and developed to form the color filter 313 shown in FIG. 26.

Here, for example, it is possible to form the following in the case a negative type photosensitive color filter material in which the exposed parts are left and the unexposed parts are dissolved in a developing solution is used. First, the same as described above, a color filter is coated on the entire surface. Next, parts corresponding to the pattern of the reflection layer 301 are exposed from the rear surface via an open mask. In this way, only the color filter formed in the aperture part 303 is exposed by self alignment using the pattern of the reflection layer 301.

In addition, as an alternative method, it is possible to leave the color filter 313 only on the aperture 303 by etching the entire surface after coating a photosensitive color filter material on the entire surface of a substrate and sufficiently flattening. In addition, the color filter may be formed using an inkjet method. In the inkjet method, fine ink droplets are sprayed from an inkjet head, the droplets are set onto the required sections on the substrate according to the pattern of the device and a liquid pattern is depicted including a functional material. Because a pattern is depicted only on the required sections compared to a conventional all surface coating method or film formation method, material can be saved.

Figure 27:
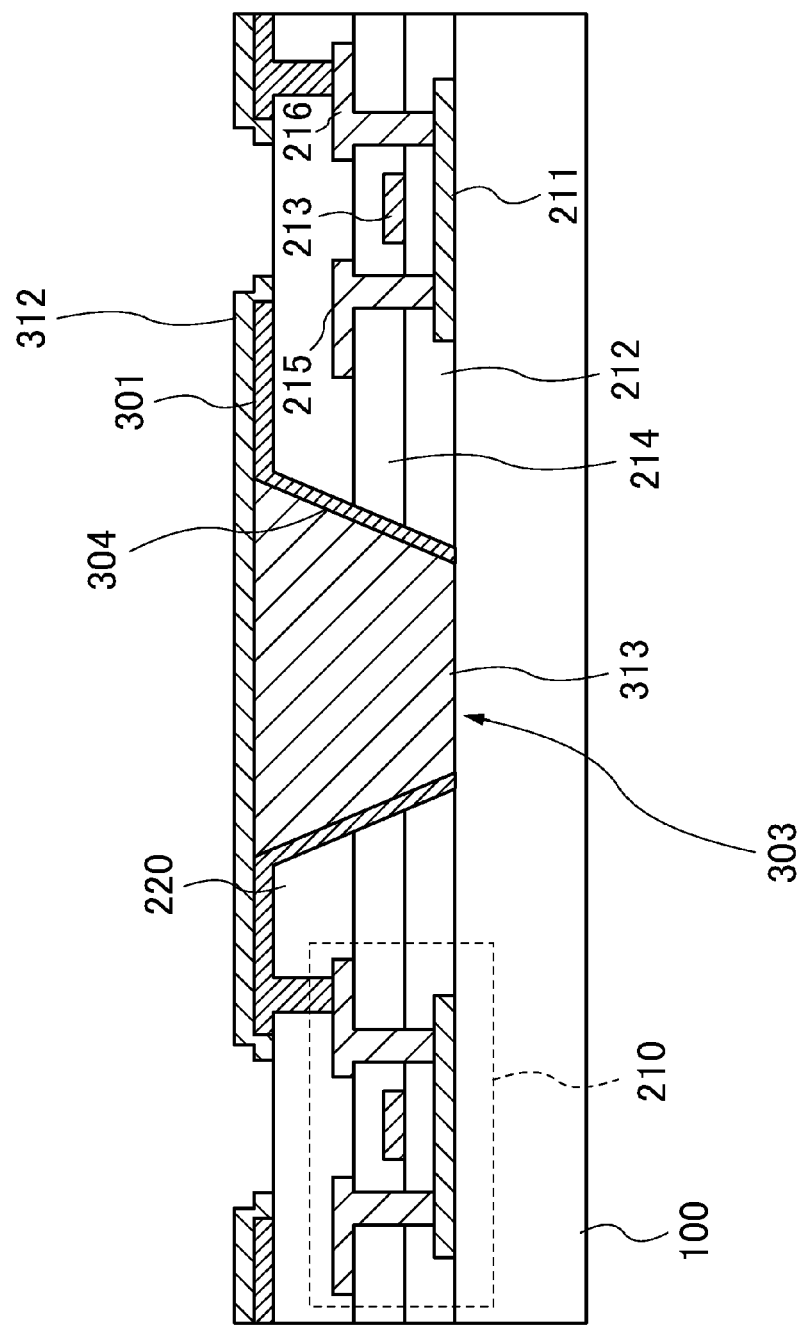
FIG. 27 is a diagram showing a process for forming a transparent conductive layer in a manufacturing method of a display device in embodiment seven of the present invention.

FIG. 27 is a diagram showing a process for forming a transparent conductive layer in a manufacturing method of the display device in embodiment seven of the present invention. After forming the transparent conductive layer 312 on the entire surface of a substrate using a sputtering method or deposition method, the parts of the pattern of the transparent conductive layer to be left are covered with a resist and the other parts are etched. In FIG. 27, a structure is shown in which the transparent conductive layer 312 is formed so that the exterior periphery end part of the pattern of the reflection layer 301 is covered, and the pattern of the reflection layer 312 is covered by the pattern of the transparent conducive layer 312. However, the present invention is not limited to this structure. The pattern of the reflection layer 301 does not have to be covered by the pattern of the transparent conductive layer 312, that is, a structure is possible wherein the exterior periphery end part of the pattern of the reflection layer 301 in the process shown in FIG. 27 may be exposed.

Here, it is preferred that the transparent conductive layer be formed using a material with high transparency such as ITO (indium, tin, oxygen), ZnO (zinc oxide) or IZO (a compound material of indium, zinc, oxide). In addition, although the etching method can be appropriately selected according to the material of the pixel electrode, for example, it is possible to use wet etching with an etchant based on oxalic acid with respect to ITO (indium, tin, oxygen).

Figure 28:
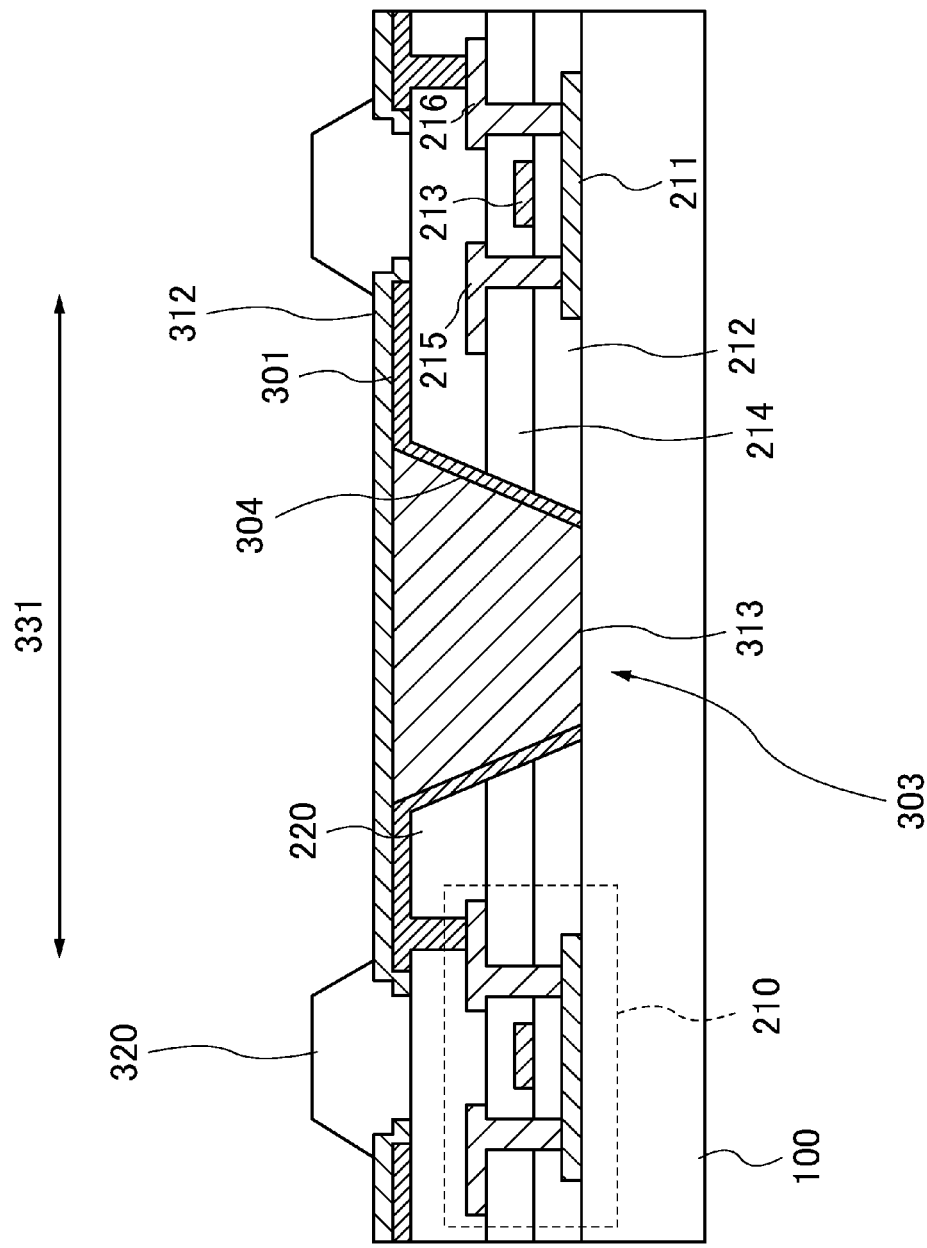
FIG. 28 is a diagram showing a process for forming an interval wall in a manufacturing method of a display device in embodiment seven of the present invention.

FIG. 28 is a diagram showing a process for forming an interval wall in a manufacturing method of the display device in embodiment seven of the present invention. An interval wall layer comprised from a photosensitive resin is formed to a desired thickness using a method such as a spin coat method above the transparent conductive layer 312 and interlayer resin layer 220 exposed from the transparent conductive layer 312. At this time, because the photosensitive resin dissolves in a solution, it is possible to further control film thickness by controlling viscosity by adjusting the concentration and adjusting the rotation speed of the substrate when coating.

After coating the photosensitive resin, the interval wall layer is formed by heating and evaporating the solution. The interval wall 320 which defines adjacent pixels is obtained by exposing and developing the interval wall layer using a photo mask. The interval wall 320 is formed at least to cover the exterior periphery end part of the pattern of the transparent conductive layer 312 or reflection layer 301. That is, it is possible to obtain the aperture region 331 which covers a step in the exterior periphery end part of the transparent conductive electrode 312 or reflection layer 301 and exposes only the flat parts. Furthermore, there is a negative type and positive type of photosensitive resin and in the case of a negative type, because the interval wall layer in the parts which are not exposed is dissolved, it is possible to obtain a square cross-sectional shape or a shape close to a trapezoid after developing. On the other hand, in the case of a positive type, unlike the negative type, because the interval wall layer in parts which are exposed is dissolved, the cross-sectional shape after development is provided with a curved surface and it is possible to obtain a shape which consecutively becomes smaller as the slanted angle with respect to the substrate surface departs from the substrate. Selection of the positive type or negative type can be made according to the desired shape of the interval wall considering each characteristic.

Figure 29:
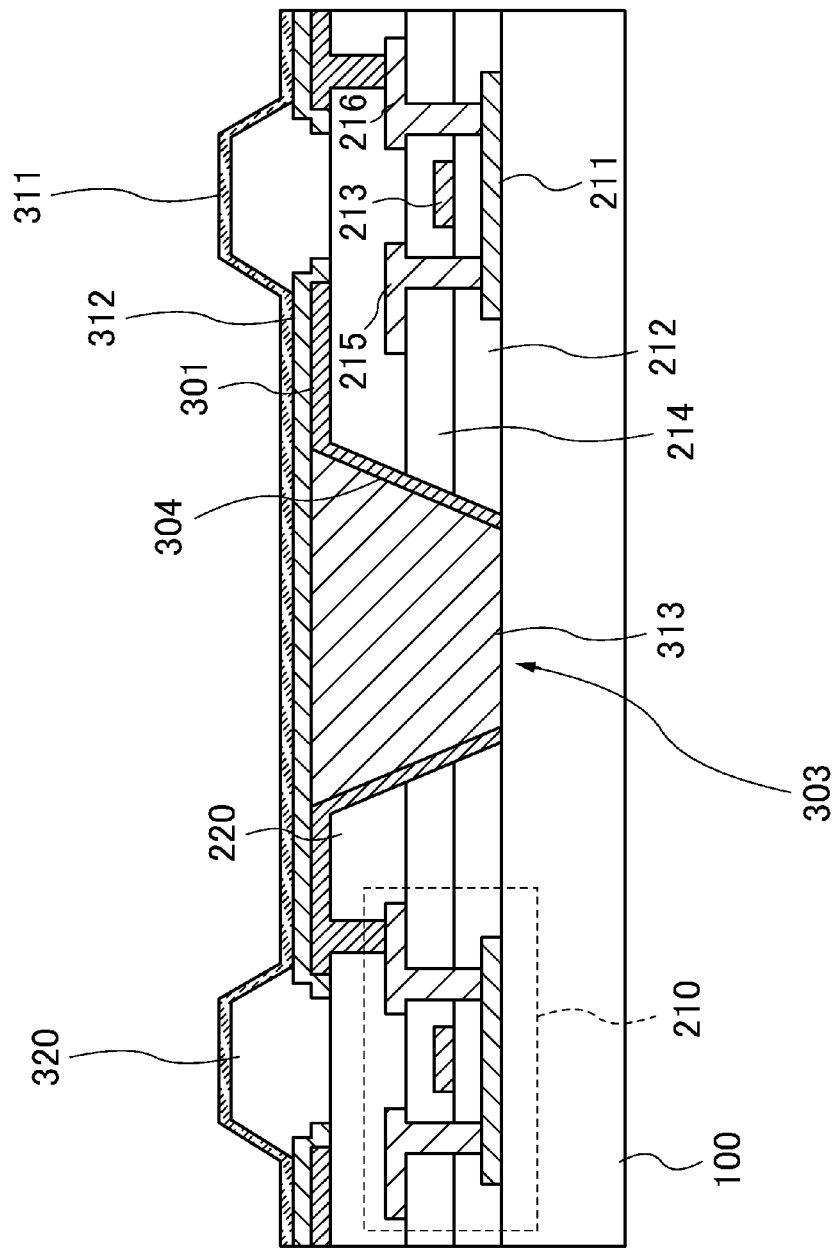
FIG. 29 is a diagram showing a process for forming a light emitting layer in a manufacturing method of a display device in embodiment seven of the present invention.
Figure 30:
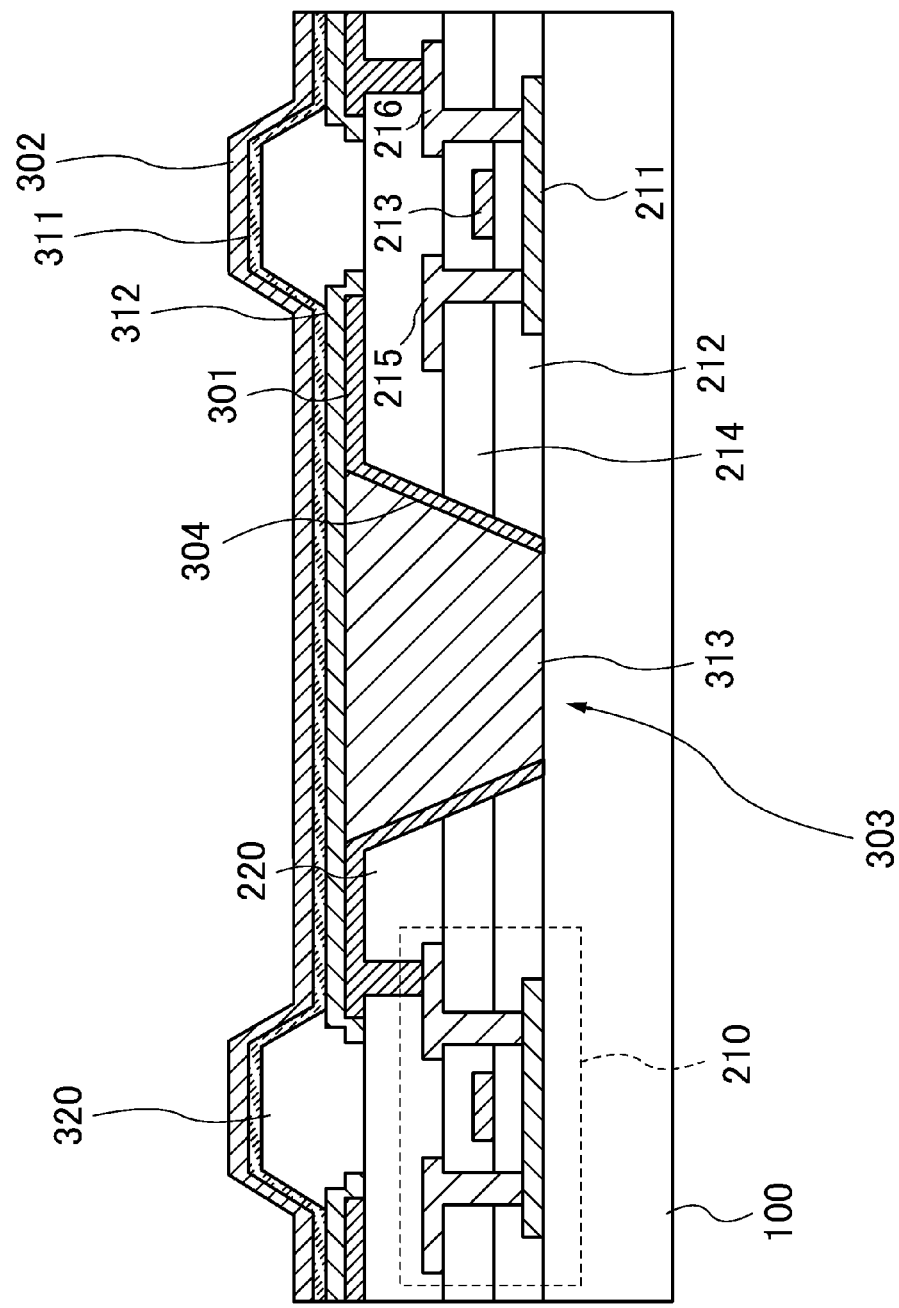
FIG. 30 is a diagram showing a process for forming a reflection layer which becomes a cathode of a light emitting layer in a manufacturing method of a display device in embodiment seven of the present invention.

FIG. 29 is a diagram showing a process for forming a light emitting layer in a manufacturing method of a display device in embodiment seven of the present invention. After forming the interval wall 320, a light emitting layer formed from a plurality of films including the light emitting layer 311 is formed on the entire surface of a substrate. In the case of a white light emitting element, it is not necessary to pattern the light emitting layer and it is possible to form the layer on the entire surface of a display region. In the case where the light emitting layer is a low molecular type, the light emitting layer 311 is formed by deposition using a metal mask with parts corresponding to a display region open. At this time, the interval wall 320 may be used as a spacer (bump component) of the metal mask. On the other hand, in the case where the light emitting layer is a high molecular type, it is possible to form the light emitting layer 311 using an inkjet method etc. In the case of a RGB single color light emitting element, a different light emitting element is formed for each RGB pixel using a metal mask etc with a fine processed pattern.

FIG. 19 is a diagram showing a process for forming a reflection layer which becomes a cathode of a light emitting element in a manufacturing method of a display device in embodiment seven of the present invention. An upper part reflection layer 302 is formed on the entire surface of a display part after forming the light emitting layer 311. The reflection layer 302 is preferred to be a material having a high level of reflectance. Specifically, it is preferred to select a material with a level of reflectivity such as aluminum, titanium, molybdenum, chrome, nickel, silver or an alloy of these and it is possible to use a method such as a vacuum deposition method or sputtering method.

When forming the reflection layer 302, an ion plating device in which a plasma does not directly contact a substrate or a facing target type sputtering device should be used so that the light emitting layer is not damaged as much as possible. Alternatively, the reflection layer 302 may be formed by depositing a thin metal film above a light emitting layer and using a sputtering method above the thin metal film. In this case, because a thin metal film functions as a protective layer, it is possible to reduce damage to the reflection layer even if the reflection layer 302 is formed using a sputtering method.

Figure 31:
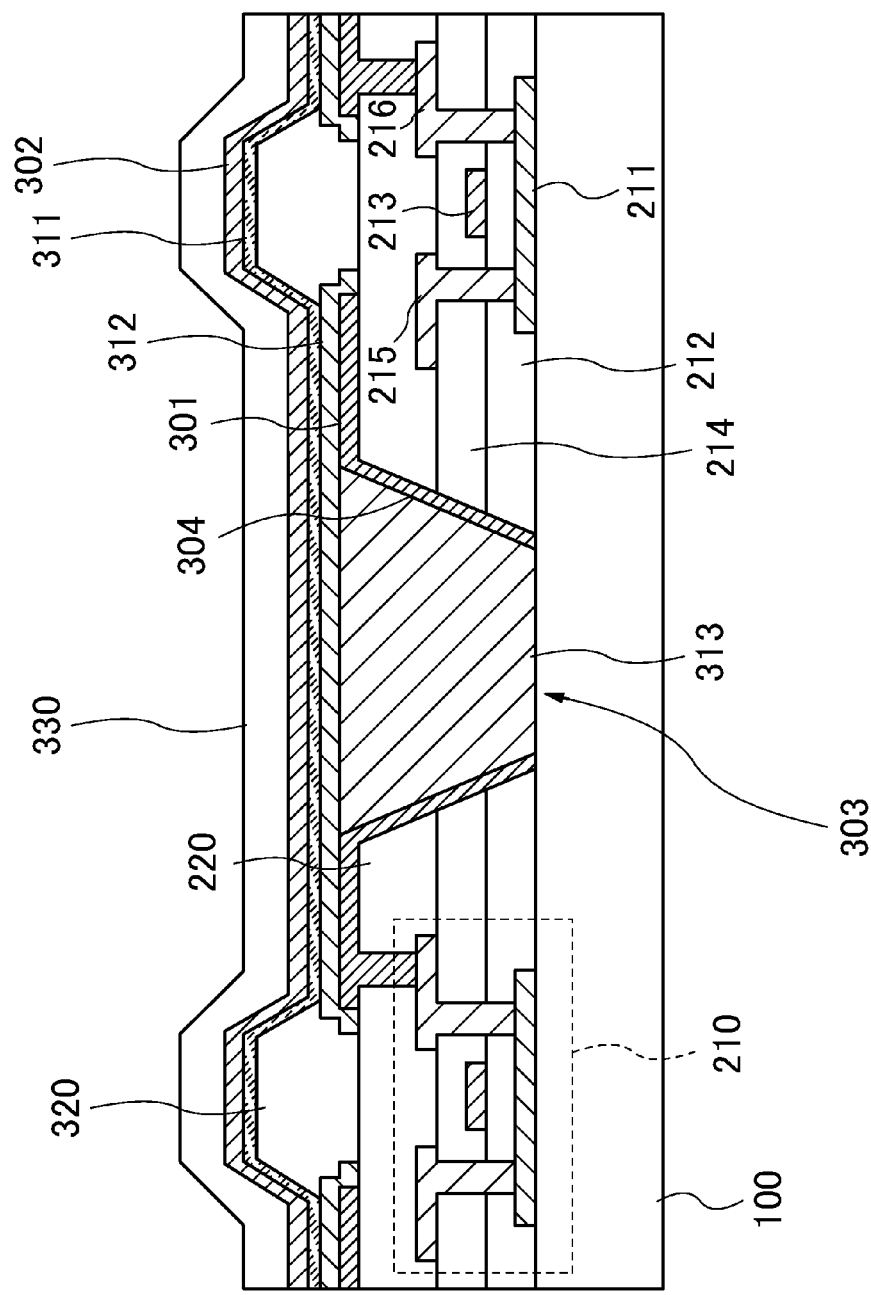
FIG. 31 is a diagram showing a process for forming a sealing layer in a manufacturing method of a display device in embodiment seven of the present invention.

FIG. 31 is a diagram showing a process for forming a sealing layer in a manufacturing method of a display device in embodiment seven of the present invention. As is shown in FIG. 31, a sealing layer 330 is formed above the reflection layer 302. The sealing layer 330 is preferred to be formed on the entire surface of a substrate using a material with a high blocking capability with respect to water or impurities, for example, it is possible to use silicon nitride, silicon oxide or a stacked film of these. The sealing layer 330 formed from an inorganic material such as silicon nitride or silicon oxide is sometimes formed with a region with a low density in a step part of a ground structure. Because water or impurities can enter from a region with a low film density and cause variation in transistor characteristics or degradation in a light emitting layer, it is necessary to form a sealing layer with good covering properties in such sections.

As described above, it is possible to manufacture a display device including the light emitting element of embodiment seven. According to the display device manufactured in this way, it is possible to improve light emitting efficiency, suppress the problem of mixed colors and obtain a wide viewing angle.

(Embodiment Nine)

Figure 32:
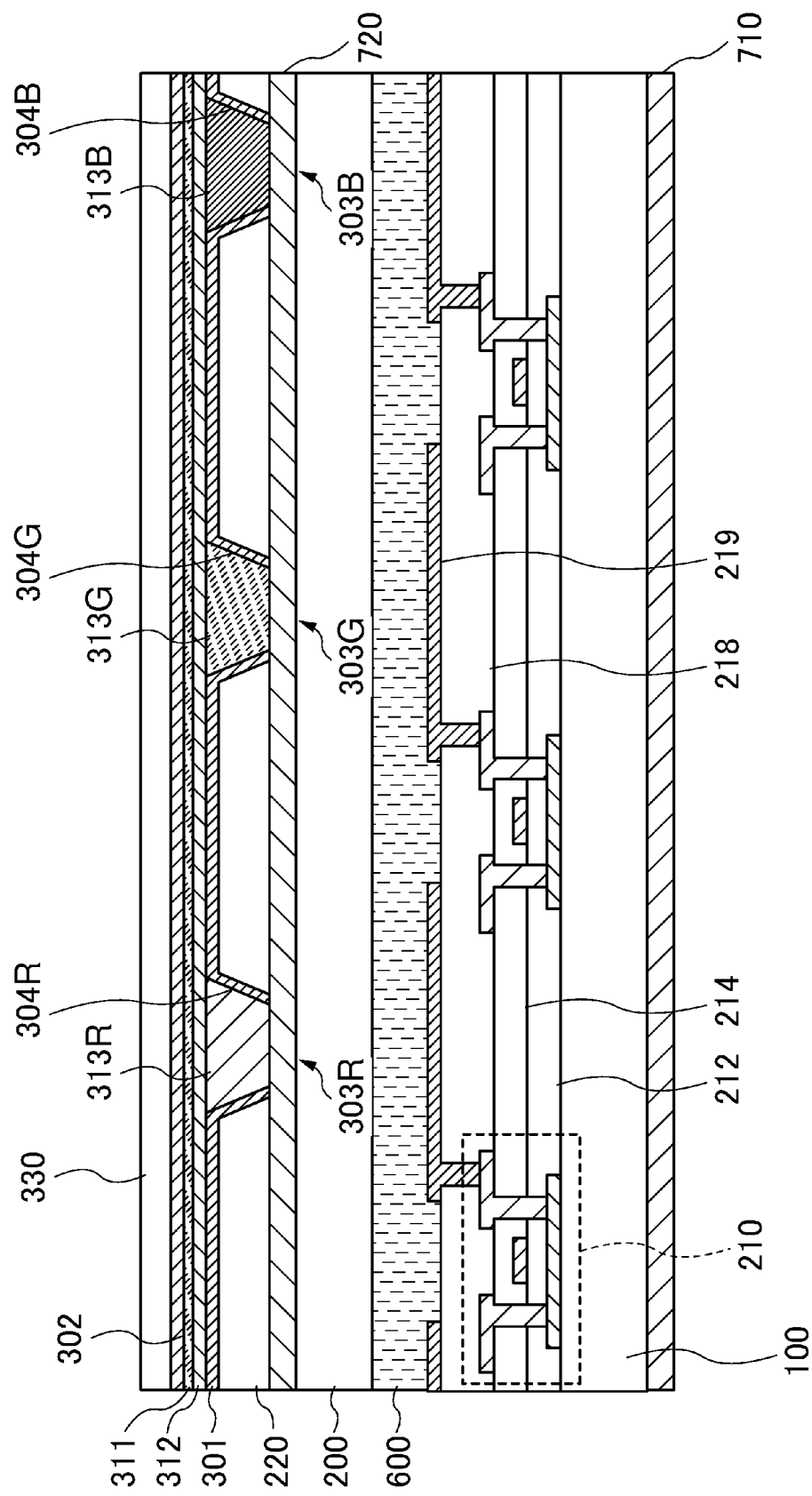
FIG. 32 is a diagram showing a cross-sectional structure of a pixel in a display device in embodiment nine of the present invention.
Figure 33:
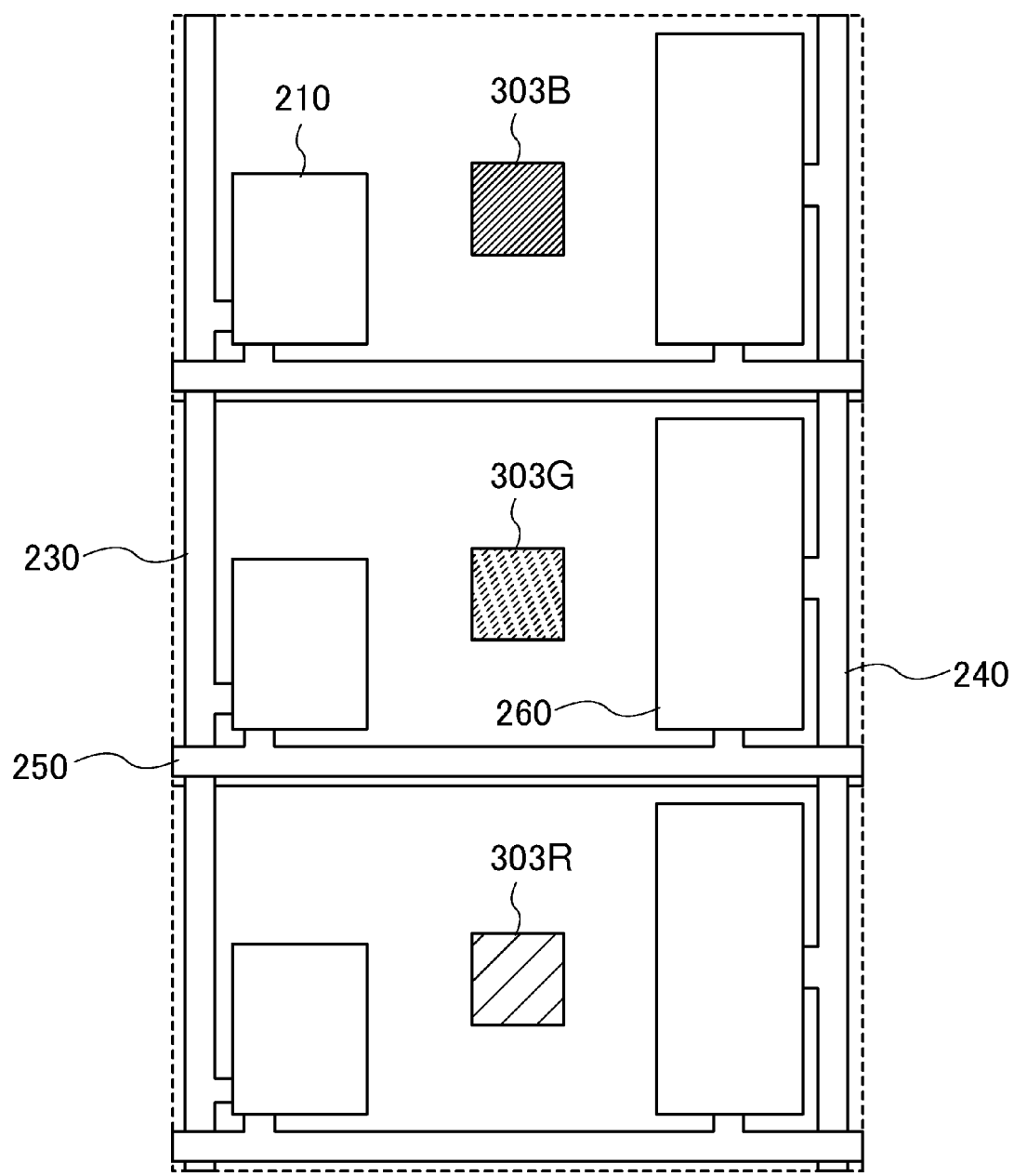
FIG. 33 is a diagram showing a planar view of a pixel in a display device in embodiment nine of the present invention.

A summary of a display device related to embodiment nine is explained using FIG. 32 and FIG. 33. In embodiment nine, an example using the light source of the present invention in a backlight of a liquid crystal display device is explained. FIG. 32 is a diagram showing a cross-sectional view of a pixel of a display device in embodiment nine of the present invention. In addition, FIG. 33 is a diagram showing a planar view of a pixel of a display device in embodiment nine of the present invention. Pixels of three colors RGB are shown in a liquid display device are shown in FIG. 32 and FIG. 33.

In FIG. 32, a top gate type transistor 210 is formed above a substrate 100. A planarized film 218 which relieves a step formed by a transistor or wiring is formed above the transistor 210 and above this a pixel electrode 219 is formed in a region corresponding to a pixel of each color. In addition, a liquid crystal layer 600 is formed between the substrate 100 arranged with the transistor 210 or pixel electrode 219 and the opposing substrate 200 facing the substrate 100. Furthermore, a first polarization plate 710 is formed on the reverse side of the transistor 210 or pixel electrode 219 of the substrate 100.

The interlayer resin layer 220 is formed via a second polarization plate 720 on the reverse side of the liquid crystal 600 of the opposing substrate 200. Aperture parts 303R, 303G, 303B (referred to as aperture part 303 in the case where these are not distinguished) which each reach the second polarization plate 720 arranged the opposing substrate 200 and including a slanted surface are arranged in the interlayer resin layer 220. The aperture part 303 is arranged so as to correspond to each pixel electrode 219. In addition, the reflection layer 301 which functions as an anode of a light emitting element is formed on an upper surface of the interlayer resin layer 220 and slanted surface of the aperture part 303. The reflection layer 301 formed on the slanted surface of the aperture part 303 includes slanted surfaces 304R, 304G, 304B (referred to as slanted surface 304 in the case where these are not distinguished).

Color filters 313R, 313G, 313B (referred to as color filter 313 in the case where these are not distinguished) including a pigment layer are formed in the aperture part 303. In FIG. 32, the color filter 313 is formed so as to fill the aperture part 303 and relieves a step formed by the aperture part 303. Here, the color filter 313 does not have to completely flatten the step formed by the aperture part 303 but can be formed so that the effects of the step formed by the aperture part 303 can be essentially ignored. As a result, it is possible to roughly uniform the thickness of the light emitting layer between an anode and cathode in a light emitting region of the light emitting layer.

A transparent conductive layer 312 which functions as a part of an anode of a light emitting element is formed above the reflection layer 301 and color filter 313. The transparent conductive layer 312 is formed on an upper surface of the reflection later 301 and upper surface of the color filter 313, and the sealing later 330 which seals so that water or impurities do not enter the light emitting layer 311, reflection layer 302 which function as a part of a cathode of a light emitting element and light emitting layer 311 are formed above the transparent conductive layer 312.

Here, the transparent conductive layer 312, light emitting layer 311 and reflection layer 302 may be formed in each pixel and formed on the entire surface of a display region formed with a pixel. In the case where the transparent conductive layer 312, light emitting layer 311 and reflection layer 302 are formed on the entire surface of a display region, when a voltage is applied between the transparent conductive layer 312 and reflection layer 302 when driving a liquid display device, the light emitting layer 311 emits light across the entire surface of the display region. Light which is generated in the light emitting layer 311 is repeatedly reflected by the pair of reflection layers 301, 302 is eventually emitted from the aperture part 303.

Although a structure in which a light source is arranged on the side of the opposing substrate 200 is shown in FIG. 32, the present invention is not limited to this structure. A light source may also be arranged on the reverse side to the transistor 210 or pixel electrode 219 of the substrate 100.

A layout of pixels of each color RGB is shown in FIG. 33, and elements such as the transistor 210, gate line 230, capacitor line 240, data line 250 and storage capacitor 260 are arranged in each pixel. Because these elements use metal films, they act as a light shielding region. The aperture part 303 is arranged in a position which does not overlap these elements. In this way, it is possible to suppress light which is emitted from the aperture part 303 from being shielded by these elements and it is possible to suppress a loss of light. As a result, it is possible to efficiently use light generated in a light emitting layer in a display.

Although a structure in which a light shielding layer is not arranged is shown in FIG. 33, the present invention is not limited to this structure. A structure is also possible in which each element such as a transistor or wiring is covered by a shielding layer.

As is shown in embodiment nine, it is possible to suppress light generated in a light emitting element from being shielded and lost and efficiently use this light in a display by using the light source of the present invention in a liquid crystal display device. As a result, it is possible to drive a display device with low power consumption. In addition, because it is possible to freely set the aperture from which light generated in a light emitting layer is emitted, it is not necessary to use a light shielding layer which is conventionally use and therefore reduce processes and obtained the effect of a reduction in costs.

Furthermore, the present invention is not limited to the embodiments described above and can be appropriately changed without departing from the scope of the invention.

What is claimed is:

1. A light emitting display device comprising:
a pair of reflection layers arranged facing each other, one of the pair of reflection layers having an aperture part;
a light emitting layer held by the pair of reflection layers;
a transparent electrode layer located between the light emitting layer and the one of the pair of reflection layers, the transparent electrode layer overlapping with the aperture part in a planar view; and
a color filter filling the aperture part.

2. The light emitting display device according to claim 1, wherein the light emitting layer is arranged in a pixel of a display region and light generated in the light emitting layer is emitted via the aperture part.

3. The light emitting display device according to claim 2, wherein the pair of reflection layers are an anode and a cathode of the light emitting layer.

4. The light emitting display device according to claim 1, wherein the transparent electrode layer is in contact with the light emitting layer.

5. The light emitting display device according to claim 1, wherein the color filter planarizes a surface of the one of the reflection layers, the surface being in contact with the transparent electrode layer.

6. The light emitting display device according to claim 1, further comprising:
an inorganic insulation layer arranged between a substrate of the display device and the aperture part.

7. The light emitting display device according to claim 1, wherein the one of the reflection layers includes a first slanted surface between the aperture part and an outer periphery end part of the one of the reflection layers.

8. The light emitting display device according to claim 7, wherein the first slanted surface extends from the aperture part continuously.

9. The light emitting display device according to claim 7, wherein a plurality of the aperture parts is arranged in one pixel, and the first slanted surface of each aperture part has a mutually different slanted angle.

10. The light emitting display device according to claim 7, wherein one of the reflection layers includes a second slanted surface further to the exterior than the first slanted surface.

11. A light source comprising:
a pair of reflection layers arranged facing each other, one of the pair of reflection layers having an aperture part;
a light emitting layer held by the pair of reflection layers;
a transparent electrode layer located between the light emitting layer and the one of the pair of reflection layers, the transparent electrode layer overlapping with the aperture part in a planar view; and
a color filter filling the aperture part.

12. The light source according to claim 11, wherein light generated by the light emitting layer is emitted via the aperture part.

13. The light source according to claim 12, wherein the pair of reflection layers are an anode and a cathode of the light emitting layer.

14. The light source according to claim 11, wherein the transparent electrode layer is in contact with the light emitting layer.

15. The light source according to claim 11, wherein the color filter planarizes a surface of the one of the reflection layers, the surface being in contact with the transparent electrode layer.

16. The light source according to claim 11, wherein the one of the reflection layers includes a first slanted surface between the aperture part and an exterior periphery end part of the one of the reflection layers.

17. The light source according to claim 16, wherein the first slanted surface extends from the aperture part continuously.

18. The light source according to claim 11, further comprising: a reflection body arranged between the pair of reflection layers, and reflecting light progressing in a direction of the exterior periphery end part of the pair of reflection layers to at least the direction of the aperture part.

19. A light emitting display device comprising:
a substrate;
a first reflection layer on the substrate, the first reflection layer having an aperture part and a slanted surface surrounding the aperture part;
a second reflection layer on an opposite of the first reflection layer from the substrate;
a light emitting layer between the first and second reflection layers;
a transparent electrode layer located between the light emitting layer and the first reflection layer, the transparent electrode layer overlapping with the aperture part in a planar view; and
a color filter between the substrate and the aperture part,
wherein the slanted surface is in contact with a first part of the transparent electrode layer,
the first part of the transparent electrode layer is in contact with a part of the light emitting layer,
the color filter is in contact with a second part of the transparent electrode layer, and
the second part is located in the aperture part and is different from the first part.

20. The light emitting display device according to claim 19,
wherein the color filter is located between the substrate and the first reflection layer, and
an end of the slanted surface is on the color filter.

* * * * *